US009508848B1

United States Patent
Akarvardar et al.

(10) Patent No.: US 9,508,848 B1
(45) Date of Patent: Nov. 29, 2016

(54) METHODS OF FORMING STRAINED CHANNEL REGIONS ON FINFET DEVICES BY PERFORMING A HEATING PROCESS ON A HEAT-EXPANDABLE MATERIAL

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/012,184

(22) Filed: Feb. 1, 2016

(51) Int. Cl.
| | |
|---|---|
| H01L 21/02 | (2006.01) |
| H01L 29/78 | (2006.01) |
| H01L 29/66 | (2006.01) |
| H01L 29/08 | (2006.01) |
| H01L 29/161 | (2006.01) |
| H01L 29/165 | (2006.01) |
| H01L 29/20 | (2006.01) |
| H01L 29/267 | (2006.01) |
| H01L 21/324 | (2006.01) |

(52) U.S. Cl.
CPC ....... *H01L 29/7843* (2013.01); *H01L 21/0214* (2013.01); *H01L 21/0217* (2013.01); *H01L 21/02164* (2013.01); *H01L 21/324* (2013.01); *H01L 29/0847* (2013.01); *H01L 29/161* (2013.01); *H01L 29/165* (2013.01); *H01L 29/20* (2013.01); *H01L 29/267* (2013.01); *H01L 29/66636* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| | | | | |
|---|---|---|---|---|
| 2009/0101982 A1* | 4/2009 | Nagatomo | ...... | H01L 21/823807 257/368 |
| 2009/0256208 A1* | 10/2009 | Okano | .................. | H01L 21/324 257/365 |
| 2014/0248751 A1* | 9/2014 | Cheng | ............. | H01L 21/823807 438/285 |
| 2015/0126008 A1 | 5/2015 | Paul et al. | | |
| 2015/0255576 A1 | 9/2015 | Liao et al. | | |
| 2015/0255608 A1 | 9/2015 | Cai et al. | | |
| 2015/0279973 A1 | 10/2015 | Akarvardar et al. | | |
| 2015/0311111 A1 | 10/2015 | Chen et al. | | |
| 2015/0333171 A1 | 11/2015 | Hsu | | |
| 2016/0172381 A1 | 6/2016 | Chan et al. | | |
| 2016/0225676 A1 | 8/2016 | Jacob et al. | | |

OTHER PUBLICATIONS

Notice of Allowance from related U.S. Appl. No. 15/012,107 dated Aug. 22, 2016.

* cited by examiner

*Primary Examiner* — Asok K Sarkar
(74) *Attorney, Agent, or Firm* — Amerson Law Firm, PLLC

(57) ABSTRACT

One illustrative method disclosed herein includes, among other things, removing at least a portion of a vertical height of portions of an overall fin structure that are not covered by a gate structure so as to result in the definition of a remaining portion of the overall fin structure that is positioned under the gate structure, wherein the remaining portion comprises a channel portion and a lower portion located under the channel portion. The method continues with the formation of a layer of heat-expandable material (HEM), performing a heating process on the HEM so as to cause the HEM to expand, recessing the HEM so as to expose edges of the channel portion and growing a semiconductor material above the HEM using the exposed edges of the channel portion as a growth surface.

21 Claims, 33 Drawing Sheets

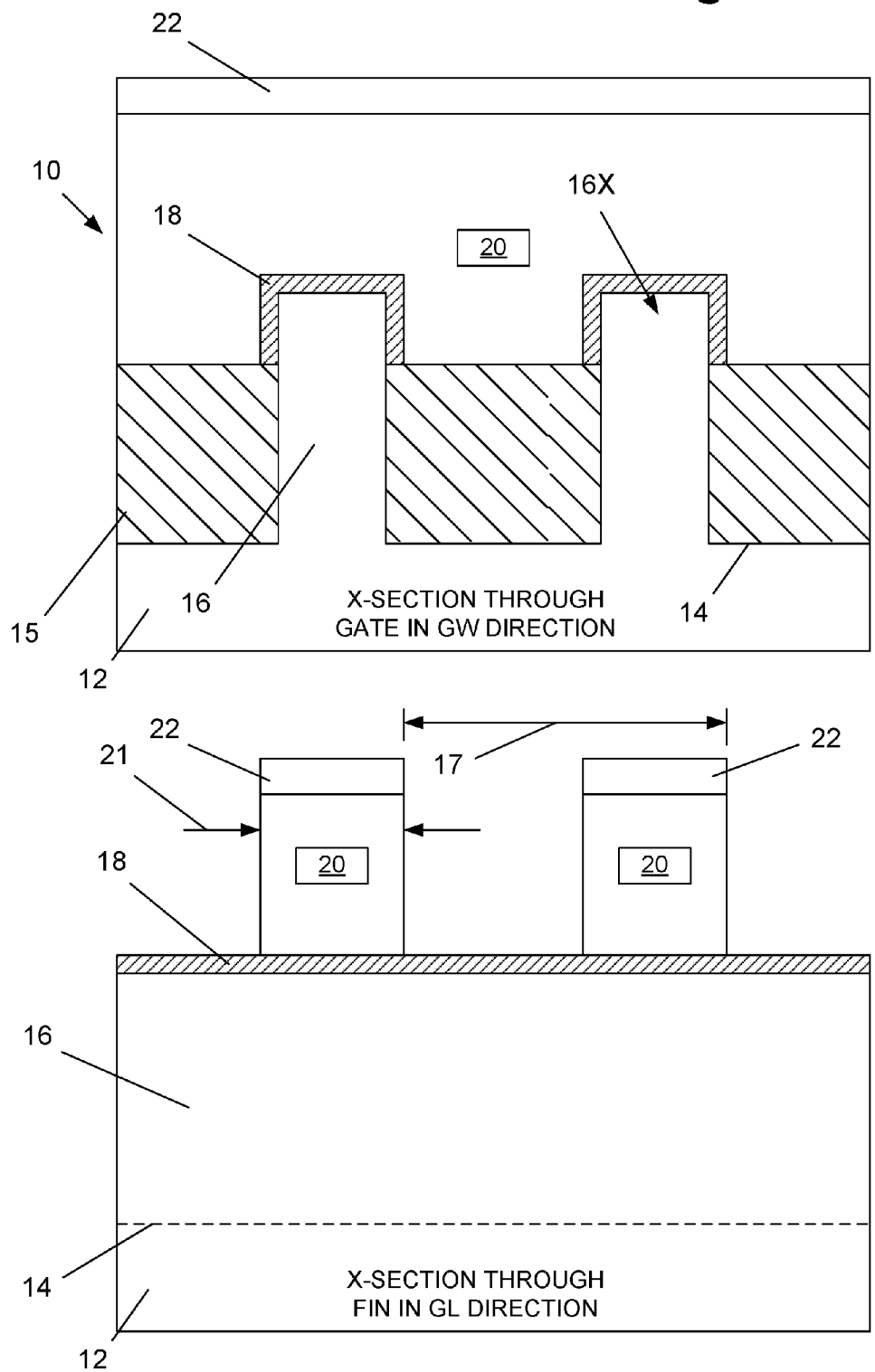

X-SECTION THROUGH
GATE IN GW DIRECTION

X-SECTION THROUGH
FIN IN GL DIRECTION

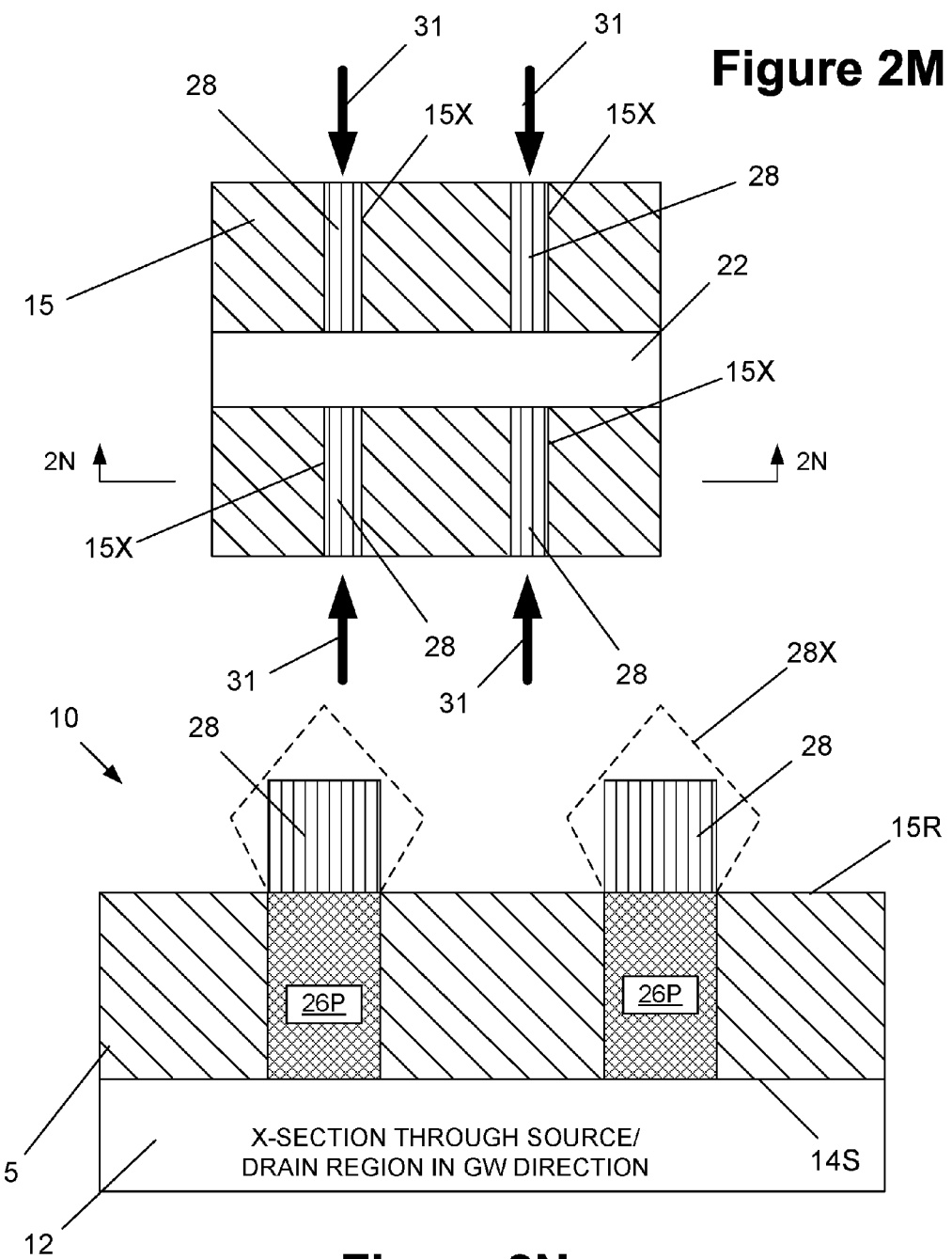

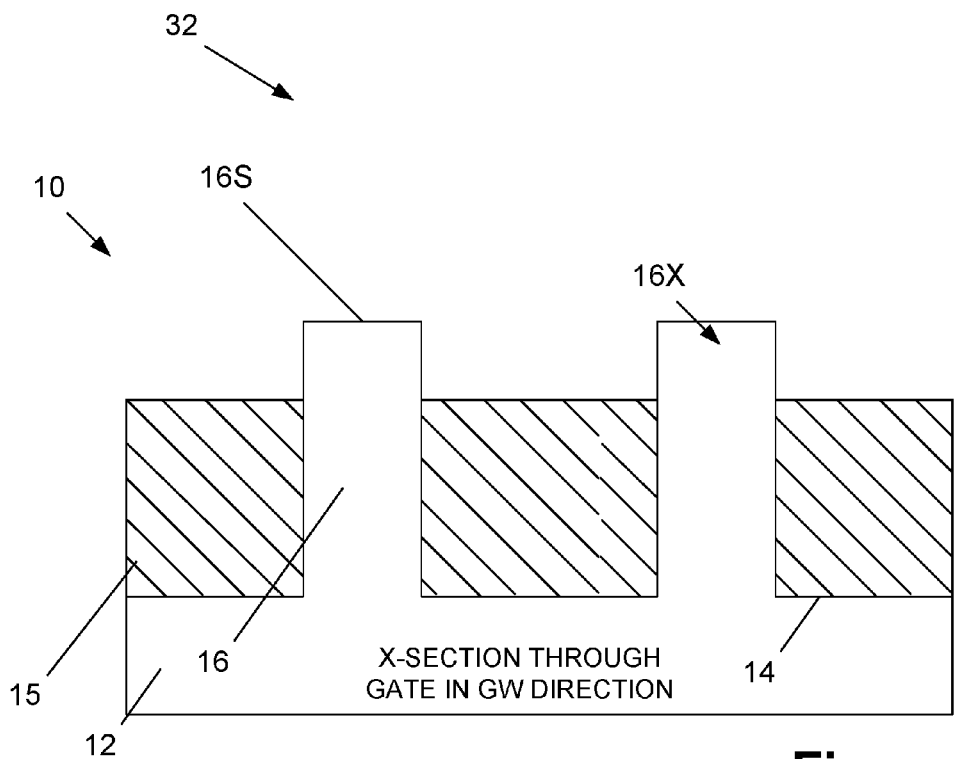
Figure 2O
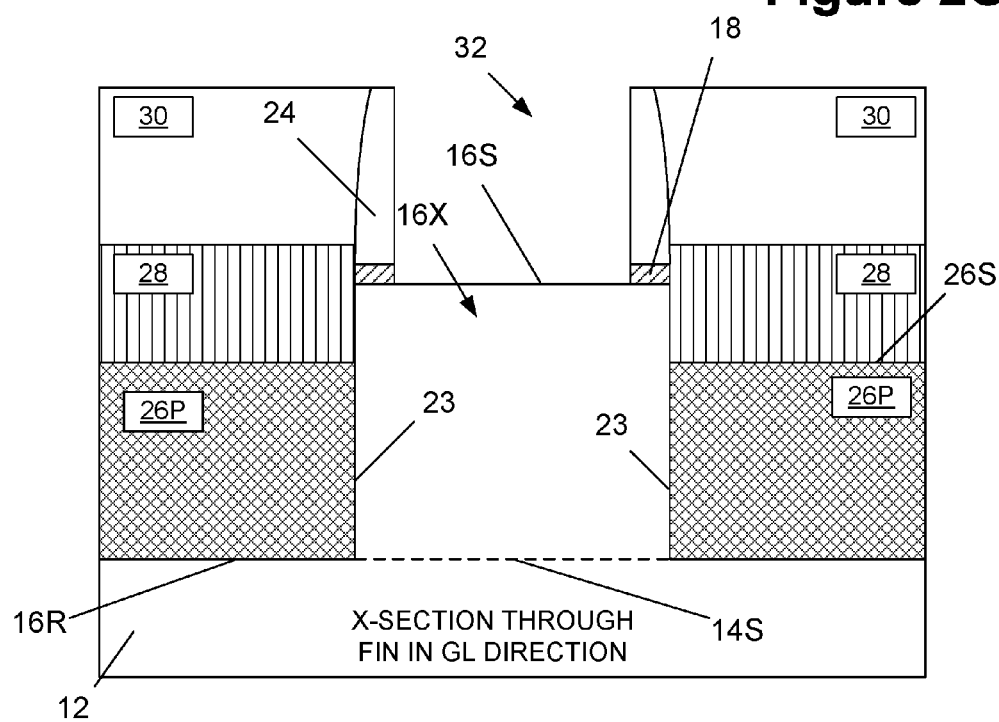

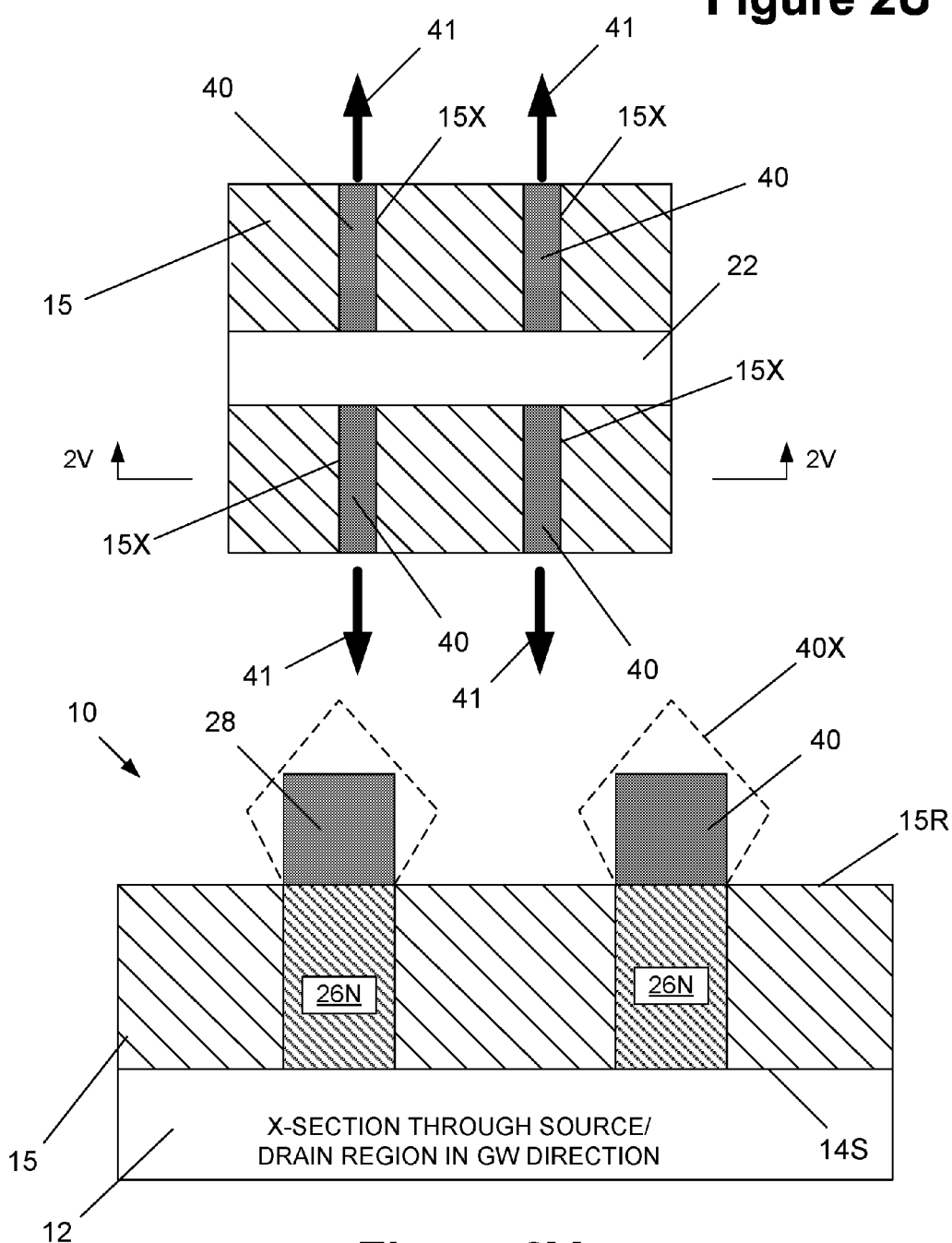

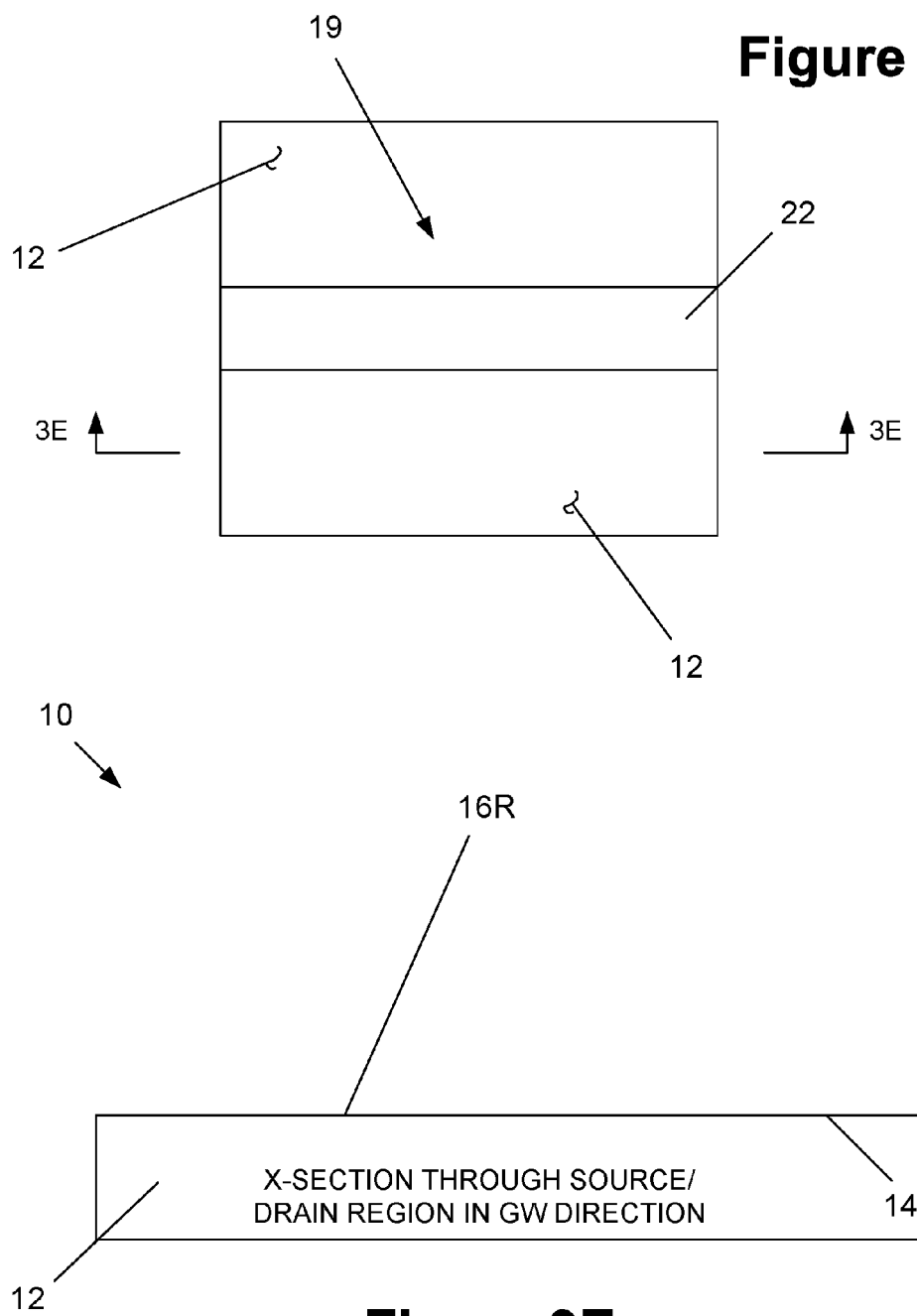

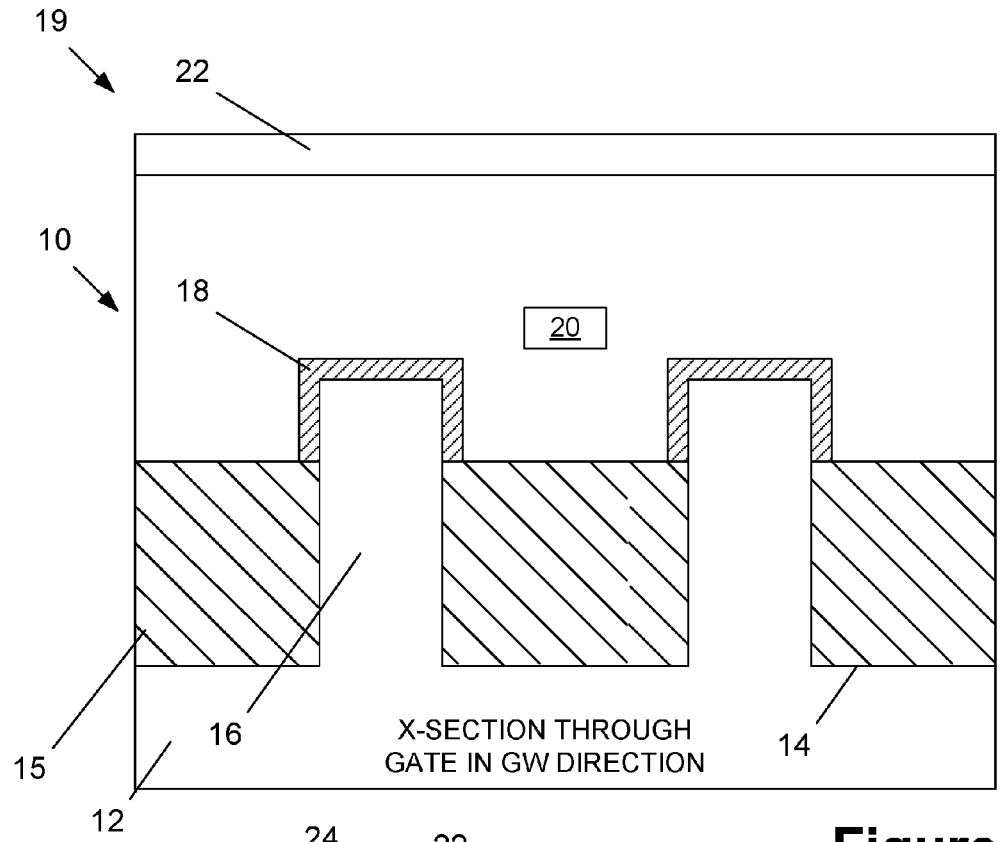
Figure 3F
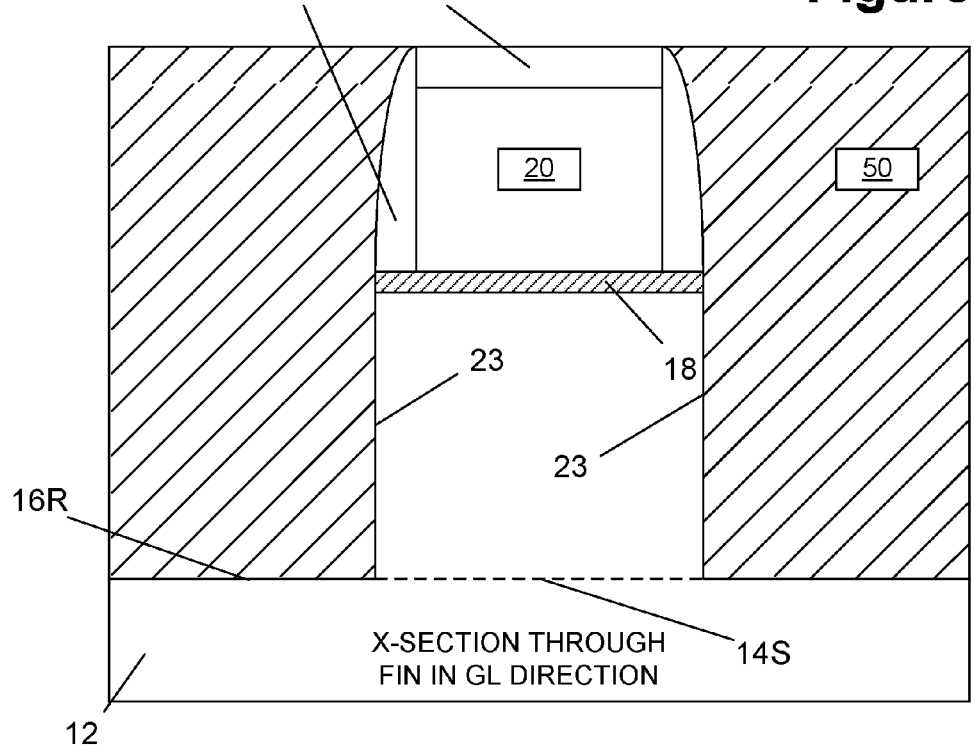

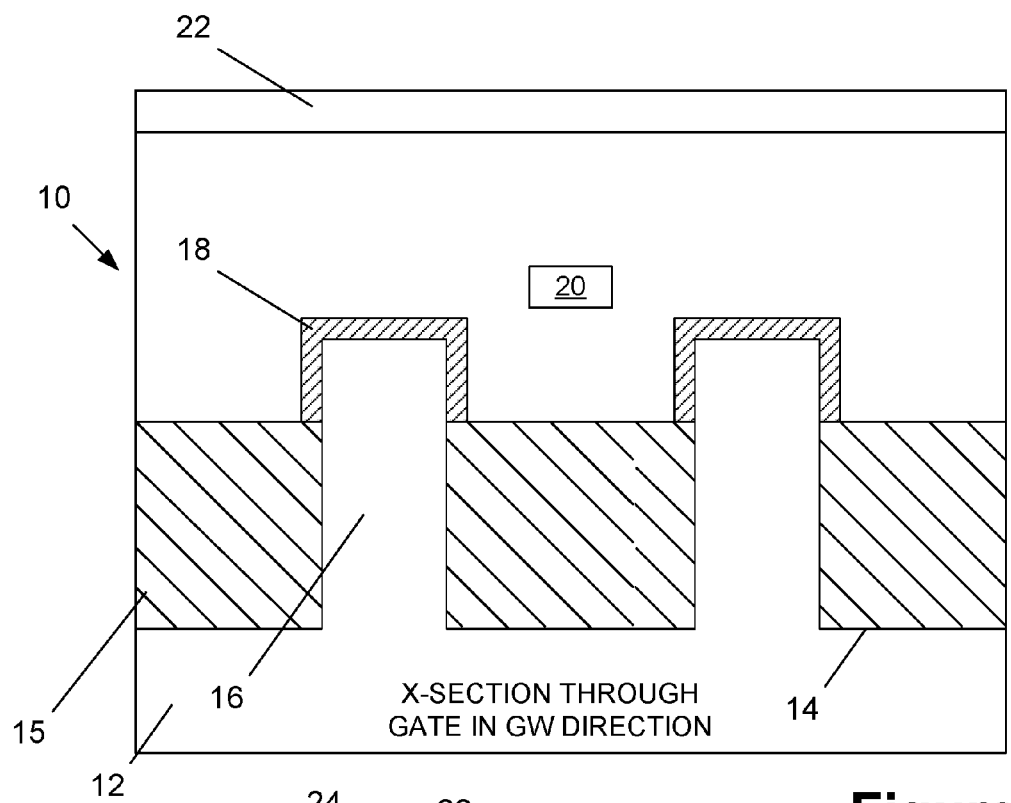
Figure 3I
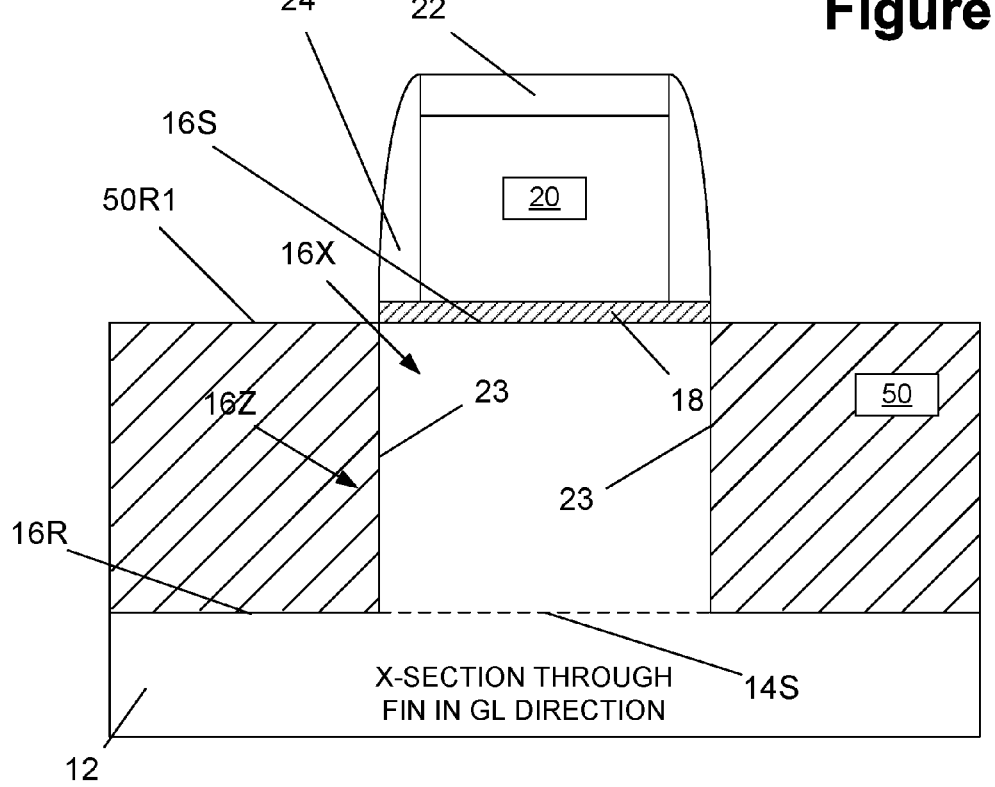

METHODS OF FORMING STRAINED CHANNEL REGIONS ON FINFET DEVICES BY PERFORMING A HEATING PROCESS ON A HEAT-EXPANDABLE MATERIAL

BACKGROUND OF THE INVENTION

1. Field of the Invention

Generally, the present disclosure relates to the manufacture of FET semiconductor devices, and, more specifically, to various methods of forming strained channel regions on FinFET devices by performing a heating process on a heat-expandable material.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

A conventional FET is a planar device wherein the entire channel region of the device is formed parallel and slightly below the planar upper surface of the semiconducting substrate. To improve the operating speed of planar FETs, and to increase the density of planar FETs on an integrated circuit product, device designers have greatly reduced the physical size of planar FETs over the past decades. More specifically, the channel length of planar FETs has been significantly decreased, which has resulted in improving the switching speed and in lowering operation currents and voltages of planar FETs. However, decreasing the channel length of a planar FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the planar FET as an active switch is degraded.

In contrast to a planar FET, there are so-called 3D devices, such as an illustrative FinFET device, which is a three-dimensional structure. FIG. 1 is a perspective view of an illustrative prior art FinFET semiconductor device 100 that is formed above a semiconductor substrate 102 wherein the fins 114 of the device 100 are made of the material of the substrate 102, e.g., silicon. The device 100 includes a plurality of trenches 113, three illustrative fins 114, a gate structure 116, a sidewall spacer 118 and a gate cap layer 120. An isolation material 117 positioned in the trenches 113 determines the active portions of the fins 114 that contribute to electrical activity. The gate structure 116 is typically comprised of a layer of insulating material (not separately shown), e.g., a layer of high-k insulating material, and one or more conductive material layers that serve as the gate electrode for the device 100. The fins 114 have a three dimensional configuration: a height H, a width W and an axial length L. The axial length L corresponds to the direction of current travel in the device 100 when it is operational. The portions of the fins 114 covered by the gate structure 116 are the channel regions of the FinFET device 100. The portions of the fins 114 that are positioned outside of the spacers 118 will become part of the source/drain regions of the device 100.

In the FinFET device 100, the gate structure 116 encloses both sides and the upper surface of the fins 114 to form a tri-gate structure so as to use a channel having a three-dimensional structure instead of a planar structure. In some cases, an insulating cap layer, e.g., silicon nitride, is positioned at the top of the fins 114 and the FinFET device only has a dual-gate structure (sidewalls only). Unlike a planar FET, in a FinFET device, a channel is formed perpendicular to a surface of the semiconducting substrate so as to increase the drive current per footprint of the device. Also, in a FinFET, the improved gate control through multiple gates on a narrow, fully-depleted semiconductor fin significantly reduces the short channel effects. When an appropriate voltage is applied to the gate electrode 116 of a FinFET device 100, the surfaces (and the inner portion near the surface) of the fins 114, i.e., the vertically oriented sidewalls and the top upper surface of the fin, form a surface inversion layer or a volume inversion layer that contributes to current conduction. Accordingly, for a given plot space (or footprint), FinFETs tend to be able to generate significantly higher drive current than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

Device manufacturers are under constant pressure to produce integrated circuit products with increased performance and lower production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance, capability and reliability of such devices. One method that has been employed to improve the performance of FinFET devices involves imparting a desired strain on the channel region of the device to enhance device performance so as to increase the mobility of charge carriers, e.g., electrons or holes, depending upon the type of device under construction. More specifically, a tensile strain is induced on the channel region of an N-type FinFET device to improve its performance, while a compressive strain is induced on the channel region of a P-type FinFET device to improve its performance. One particular technique used to create such desired strain conditions in the channel region of the devices involves, after forming the gate structure, removing a portion of the fins in the source/drain region and replacing the removed portions of the fins with a different semiconductor material (e.g., SiGe, Ge and SiC materials) that has a different lattice constant than that of the original fins. This replacement semiconductor material is normally formed by performing one or more selective epi deposition processes. As a result of the addition of the lattice mismatched materials in the source/drain regions, a desired strain—tensile or compressive—may be induced on the channel region of the device.

Unfortunately, as device dimensions continue to decrease, and particularly as the gate pitch of the devices continues to decrease, there is very little volume of the lattice mismatched materials in the source/drain regions. As a result, the strain induced by the relatively small amount of the lattice mismatched materials in the source/drain regions may be less than effective in creating the desired amount of strain on the channel region and the strain that is induced may not be as stable or permanent as would otherwise be desired.

The present disclosure is directed to various methods of forming strained channel regions on FinFET devices on integrated circuit products by performing a heating process on a heat-expandable material that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming strained channel regions on FinFET devices by performing a heating process on a heat-expandable material. One illustrative method disclosed herein includes, among other things, forming an overall fin structure in a semiconductor substrate, forming a gate structure above a layer of insulating material and around an exposed portion of the overall fin structure and removing at least a portion of the vertical height of portions of the overall fin structure that are not covered by the gate structure so as to result in the definition of a remaining portion of the overall fin structure that is positioned under the gate structure, wherein the remaining portion comprises a channel portion and a lower portion located under the channel portion. In this example, the method also includes removing substantially all of the layer of insulating material that is not covered by the gate structure, forming a layer of heat-expandable material adjacent the remaining portion of the overall fin structure, performing a heating process on the layer of heat-expandable material so as to cause the layer of heat-expandable material to expand, recessing the layer of heat-expandable material such that it has a recessed upper surface that exposes edges of the channel portion of the remaining portion of the overall fin structure, and growing a semiconductor material above the recessed upper surface of the layer of heat-expandable material using the exposed edges of the channel portion as a growth surface.

BRIEF DESCRIPTION OF THE DRAWINGS

The disclosure may be understood by reference to the following description taken in conjunction with the accompanying drawings, in which like reference numerals identify like elements, and in which.

Figure 1:
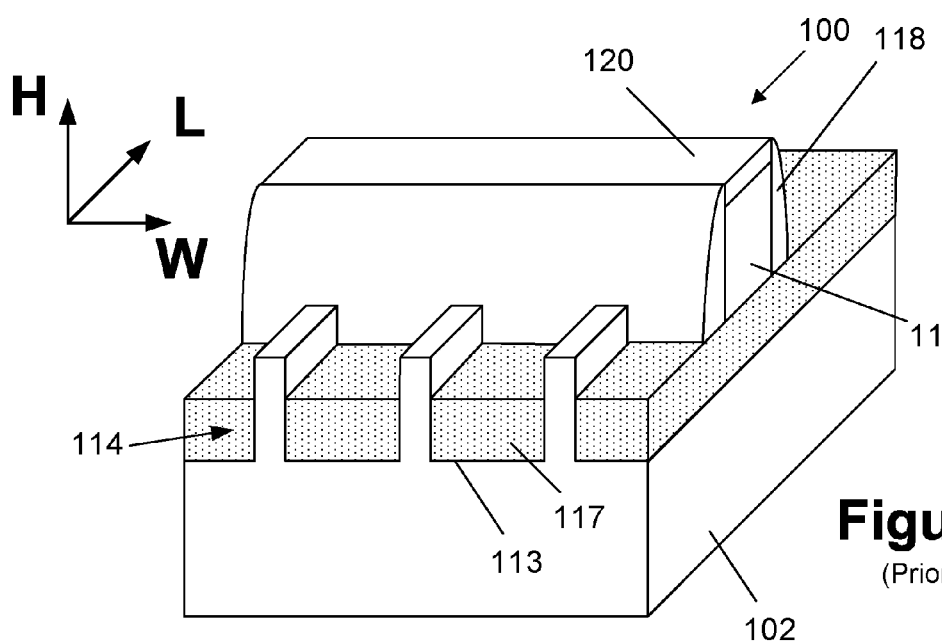
FIG. 1 depicts an example of an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods disclosed herein may be employed in manufacturing both N-type devices and P-type devices, and the gate structures of such devices may be formed using either so-called "gate-first" or "replacement gate" ("gate-last" or "gate-metal-last") techniques. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

Figure 2A:
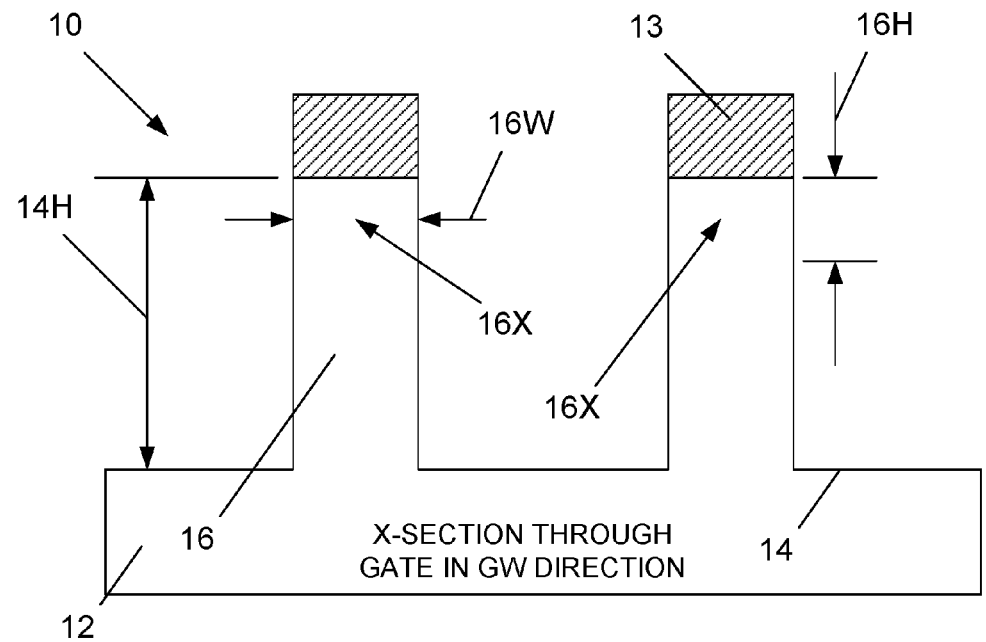
FIGS. 2A-2W depict various illustrative novel methods disclosed herein for forming strained channel regions on FinFET devices.
Figure 2A:
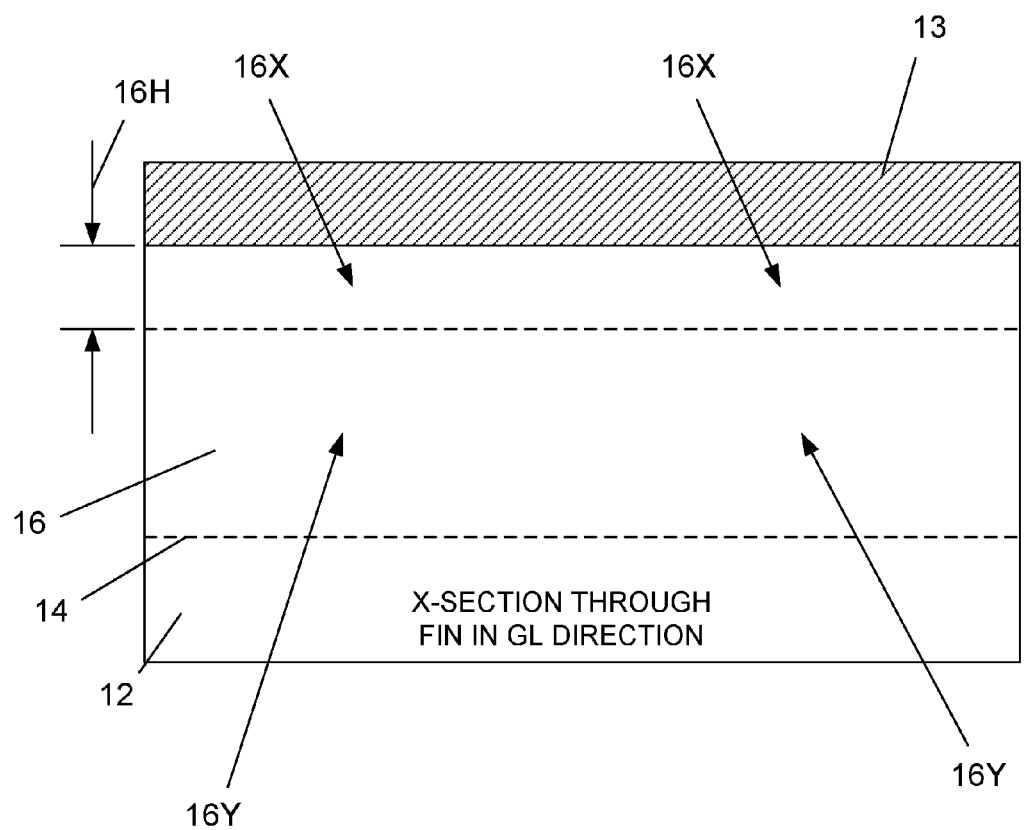
Figure 2B:
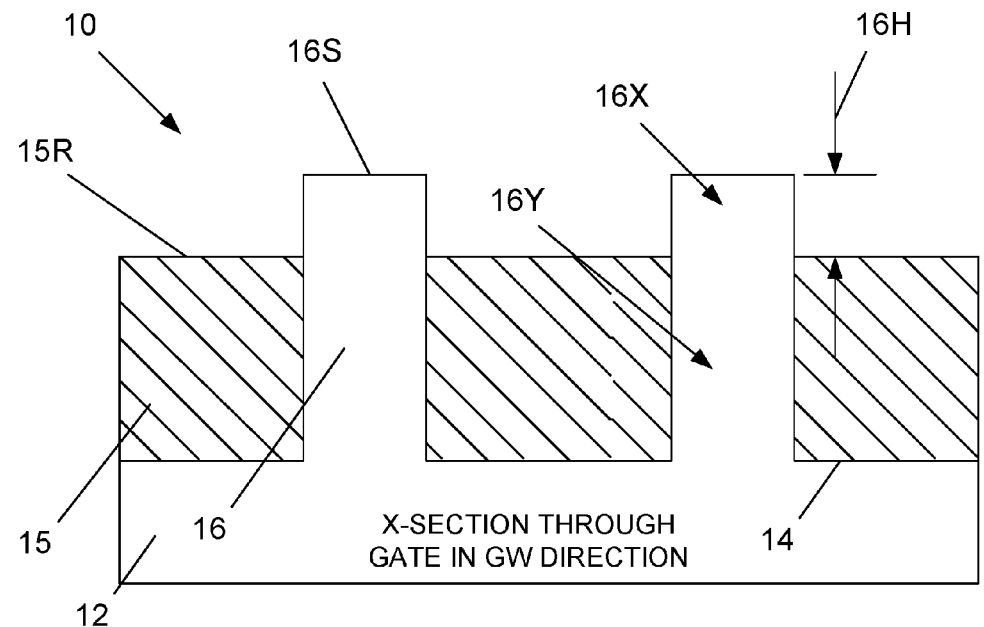
Figure 2B:
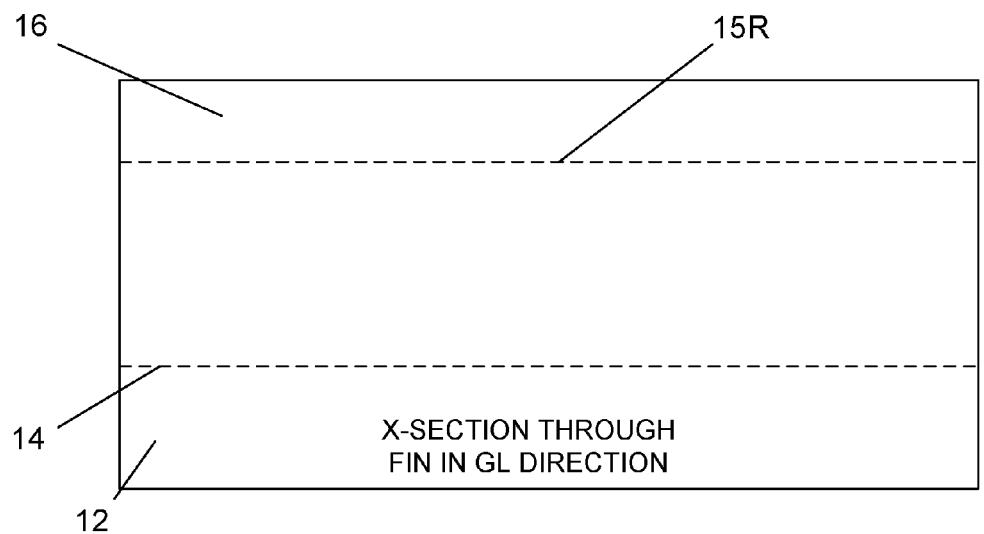
Figure 2C:
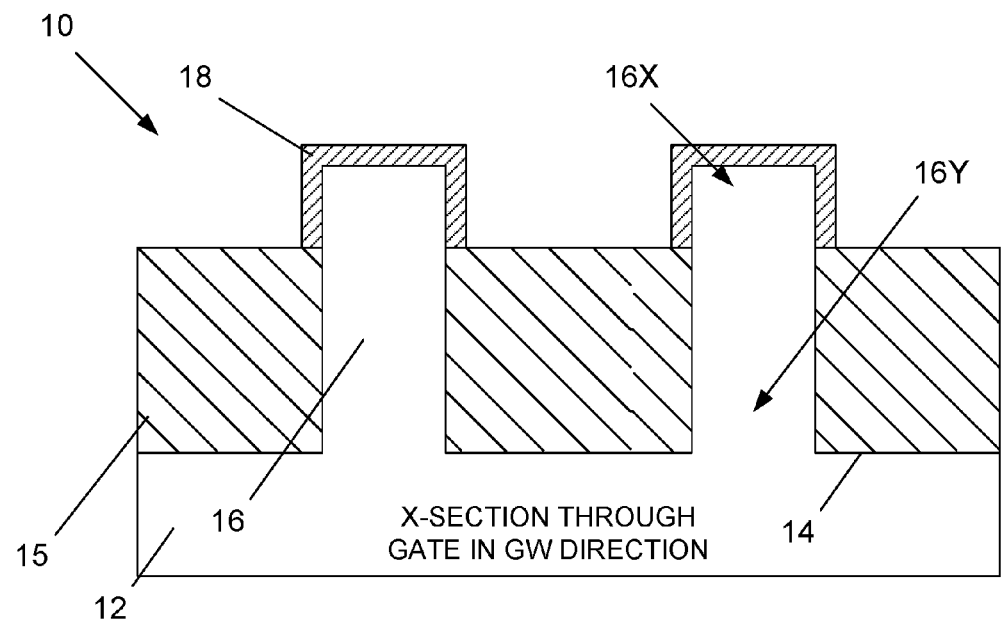
Figure 2C:
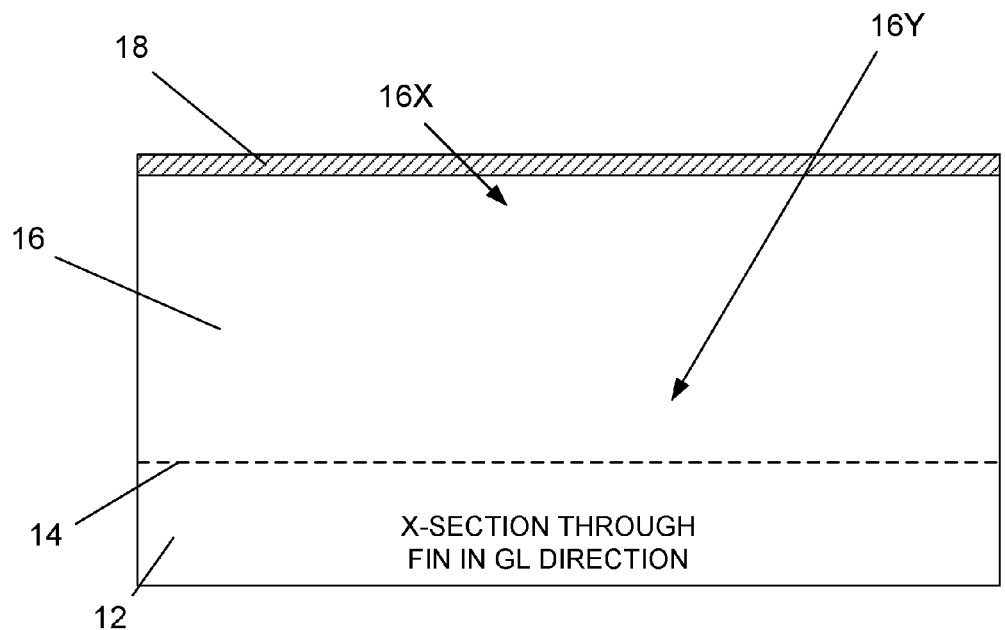
Figure 2E:
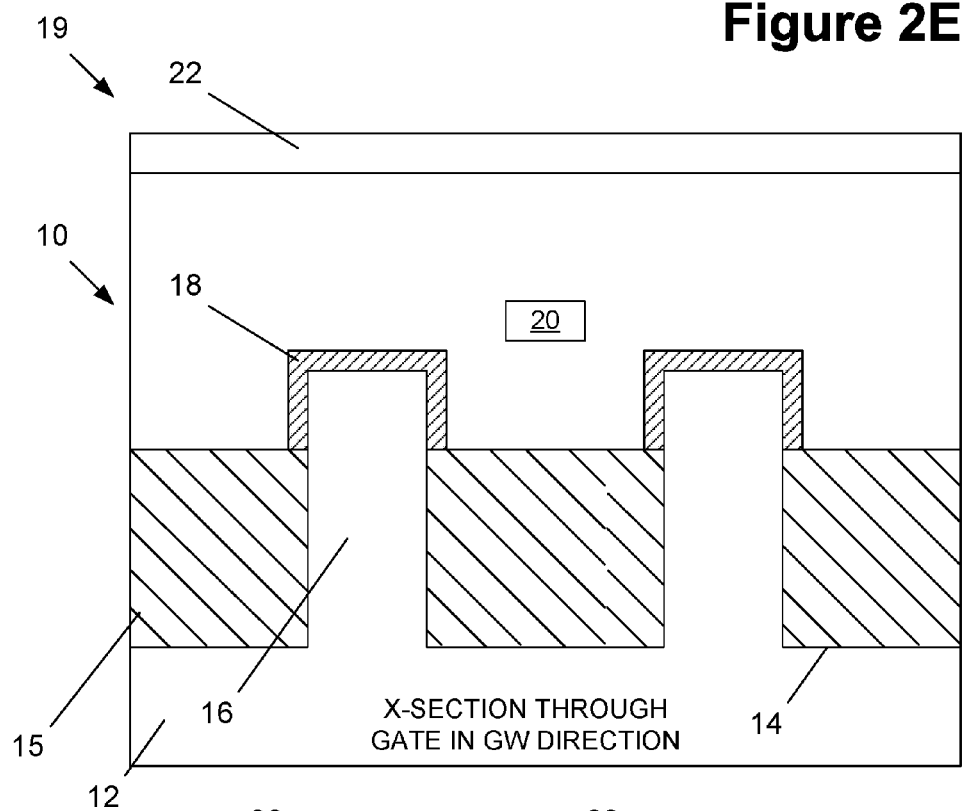
Figure 2E:
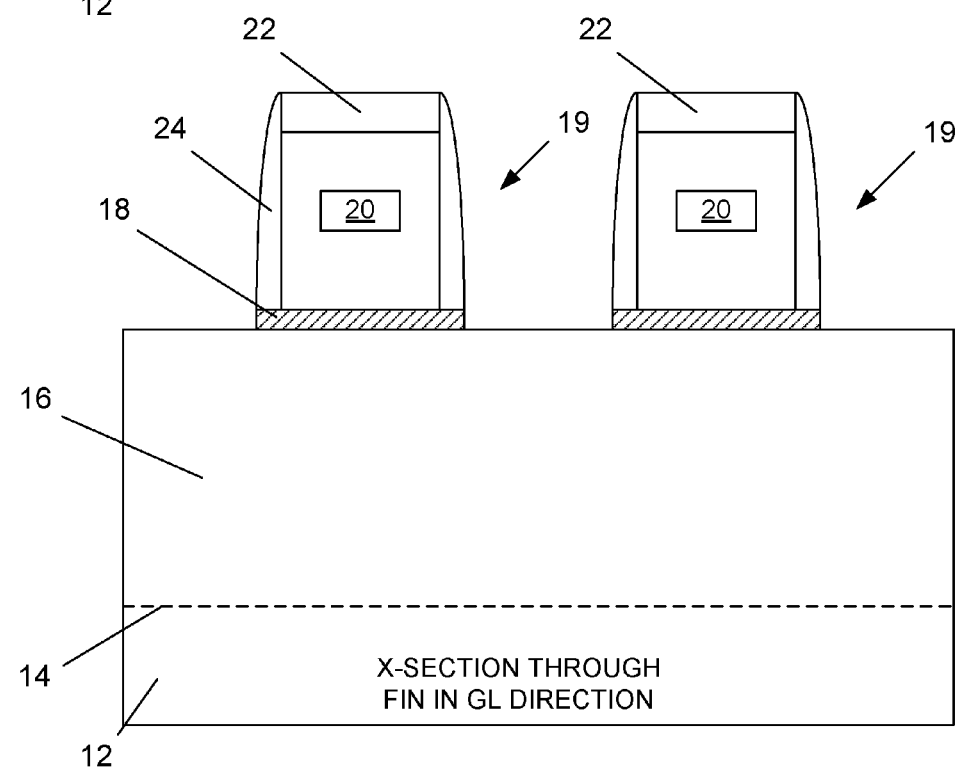
Figure 2F:
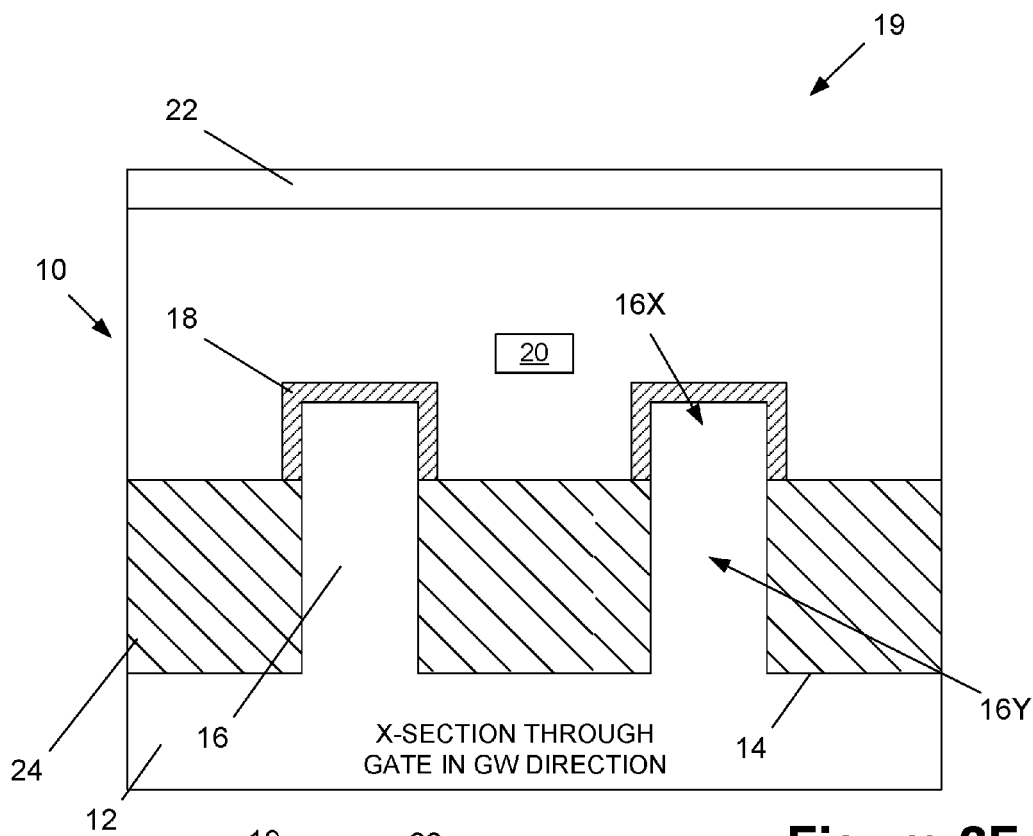
Figure 2F:
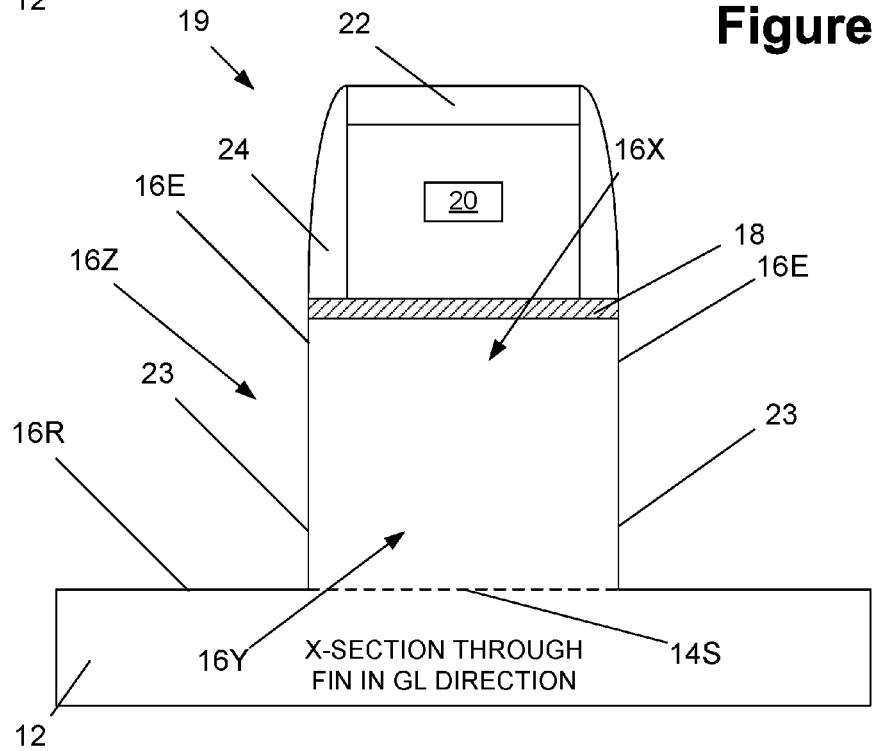
Figure 2G:
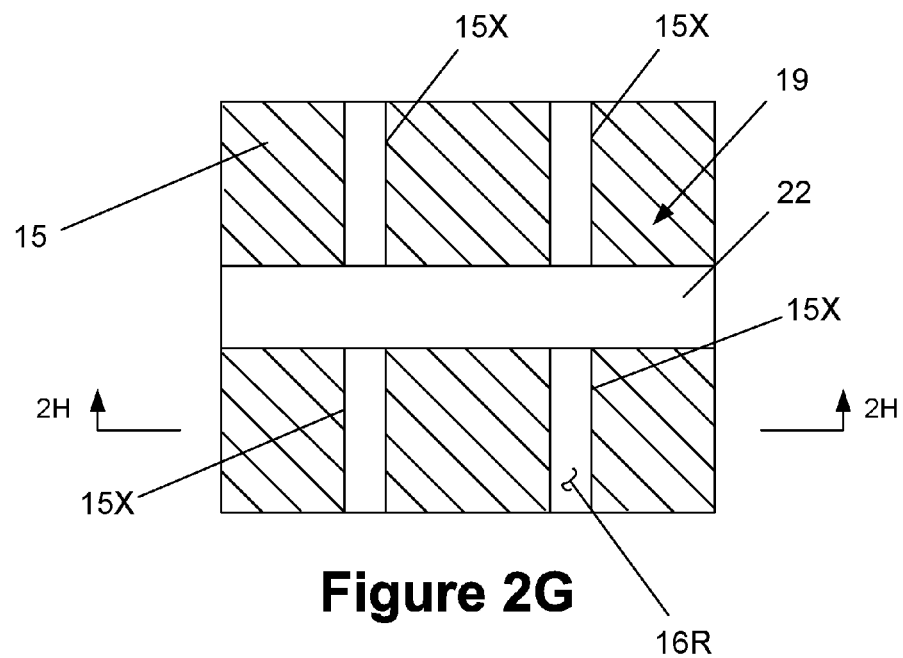
Figure 2H:
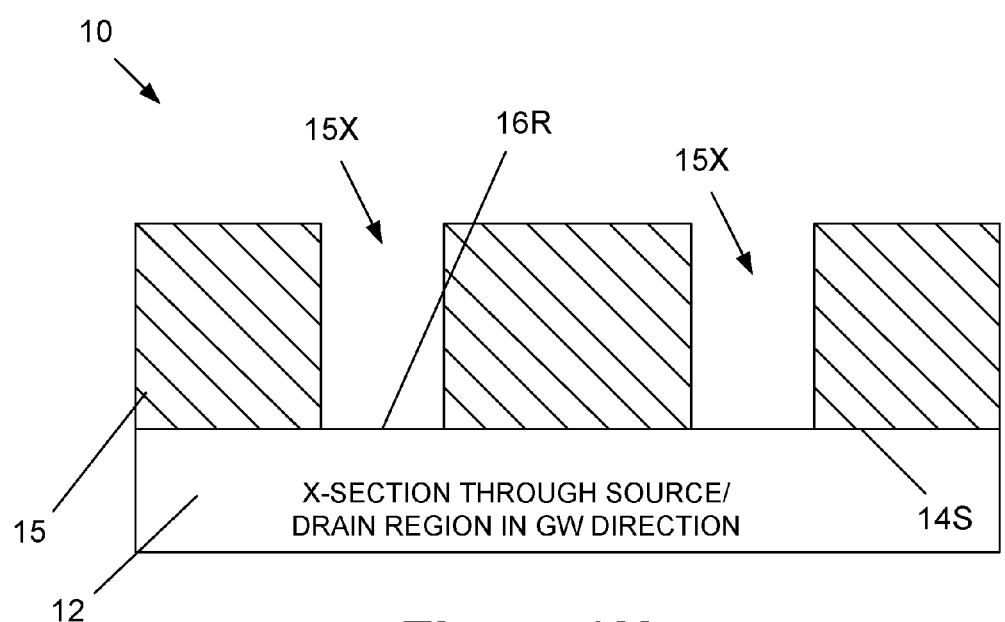
Figure 2I:
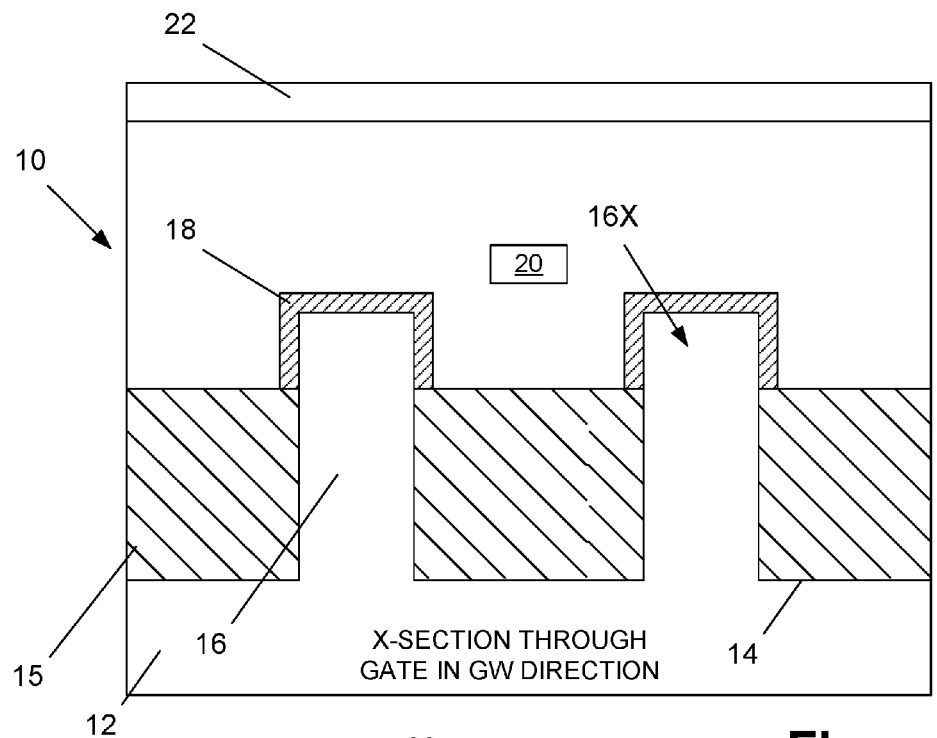
Figure 2I:
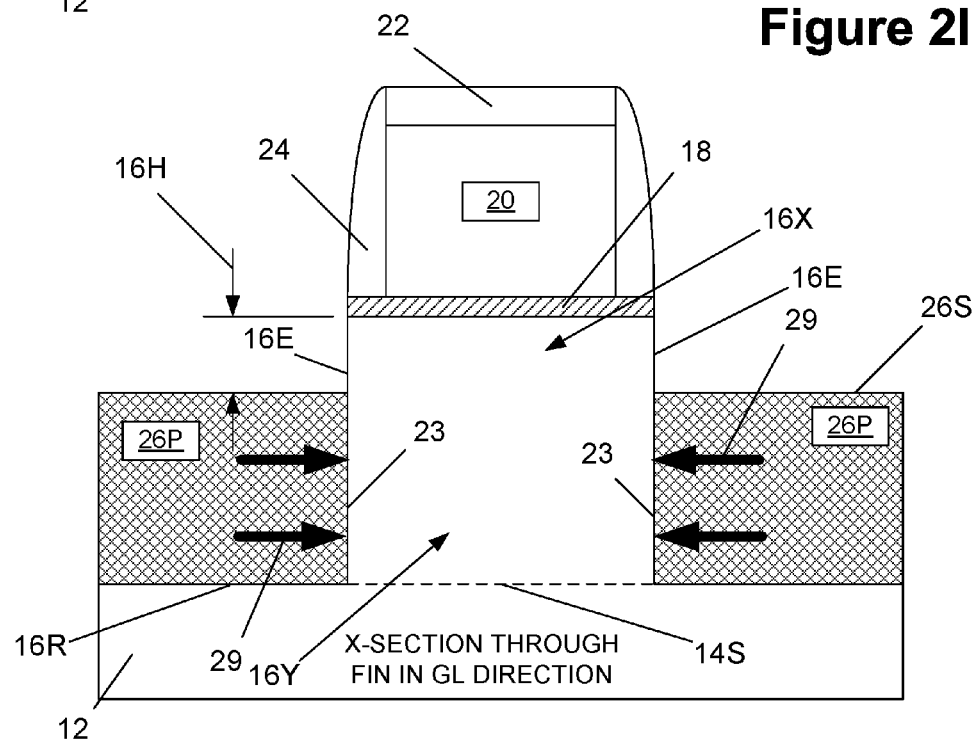
Figure 2J:
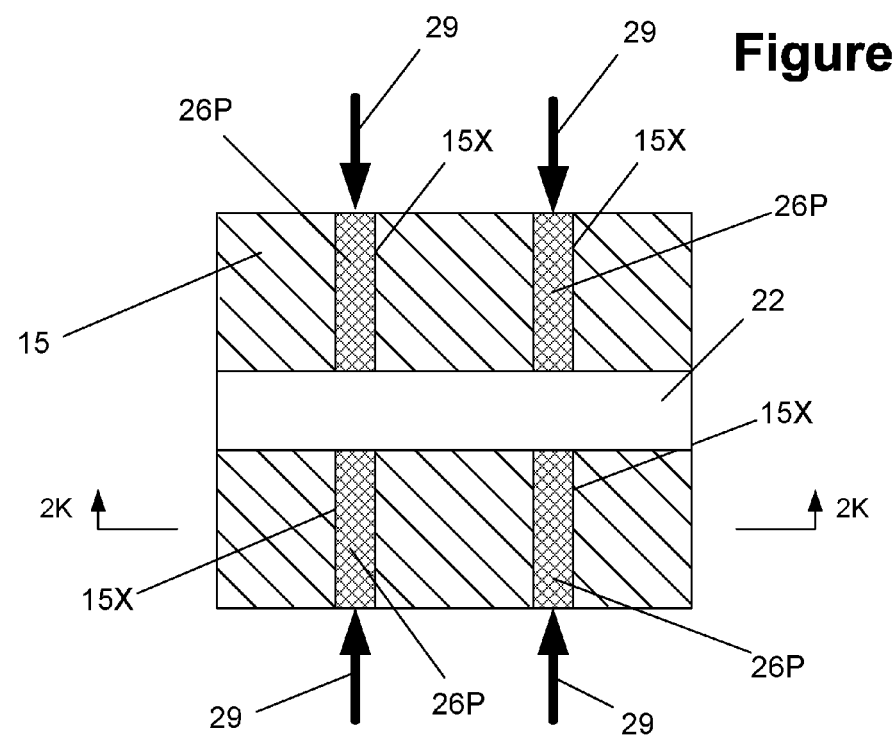
Figure 2K:
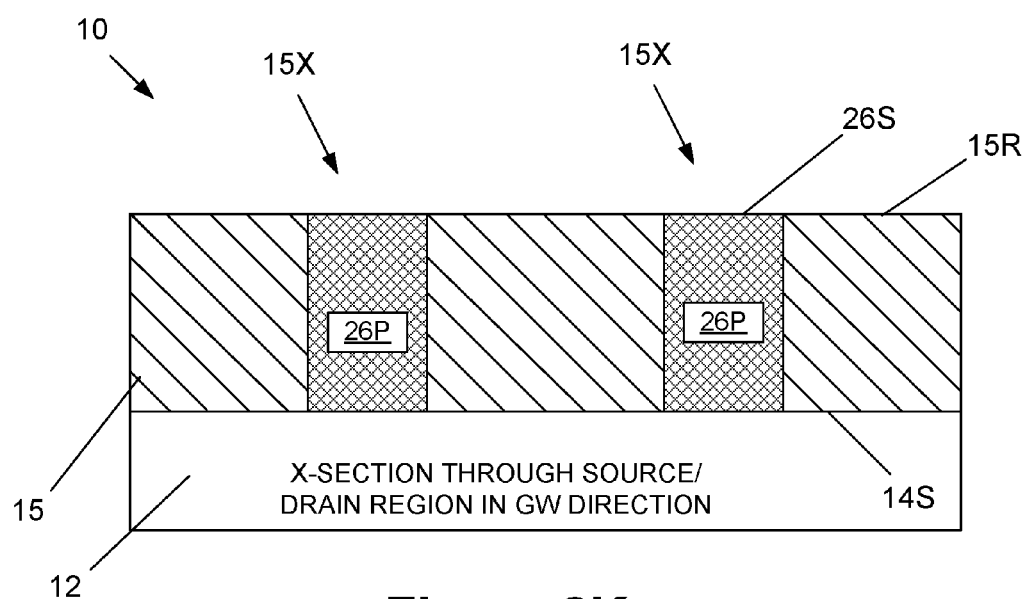
Figure 2L:
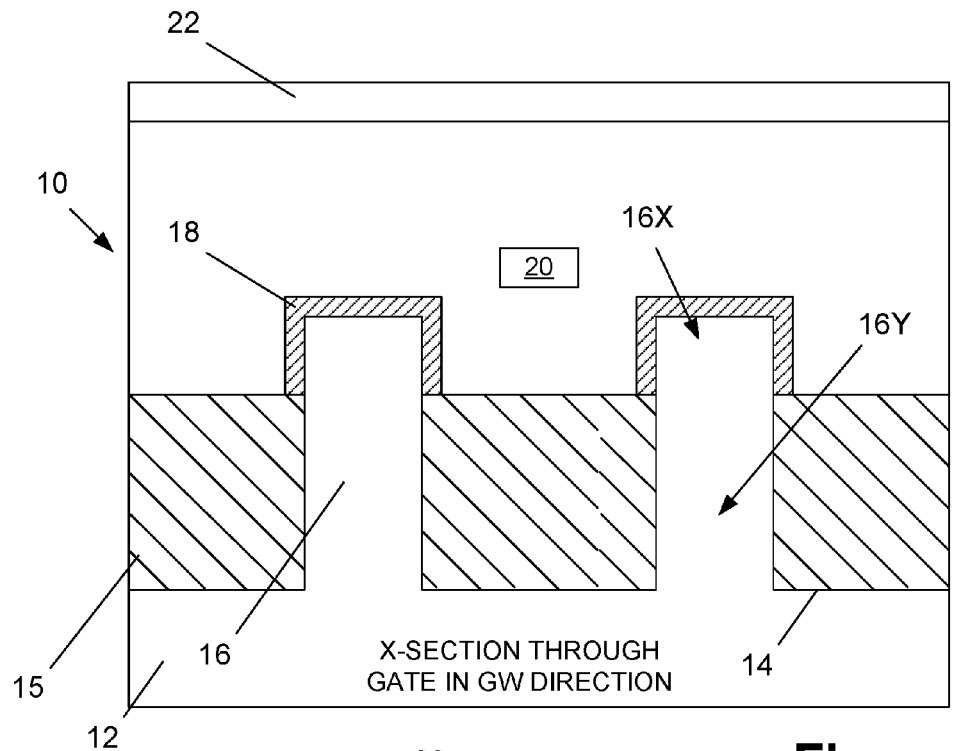
Figure 2L:
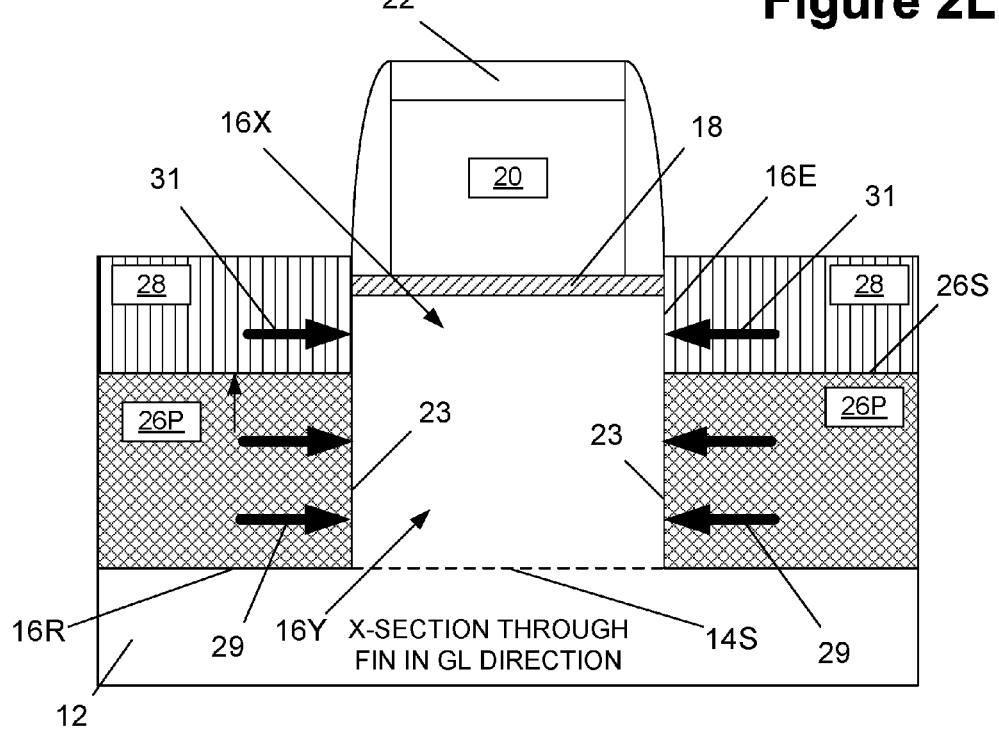
Figure 2P:
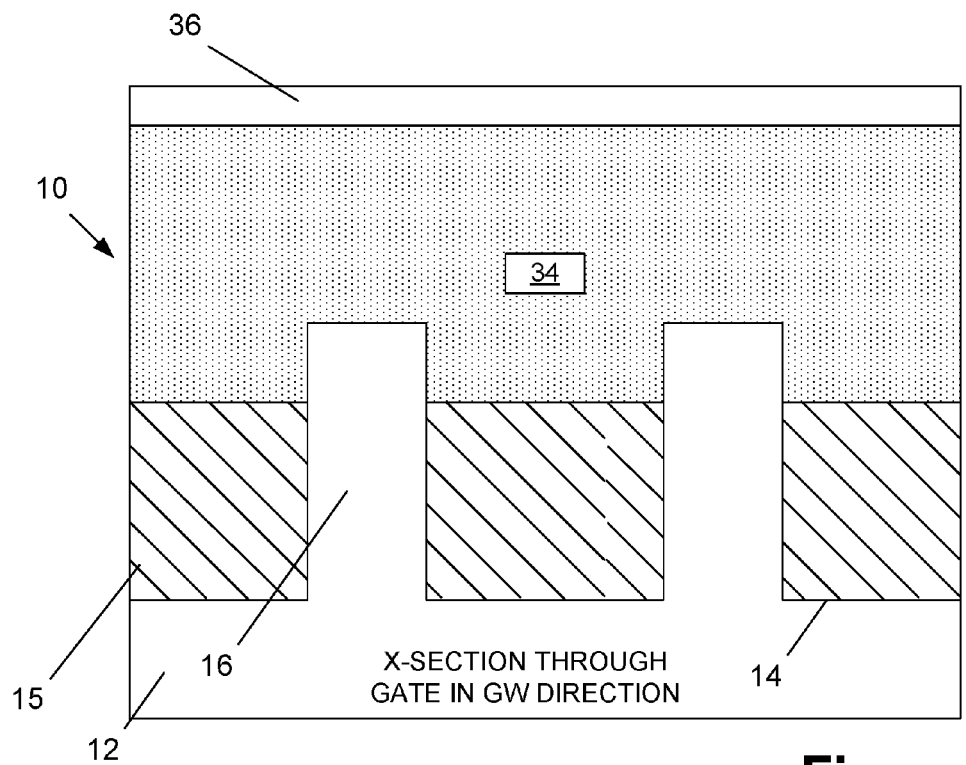
Figure 2P:
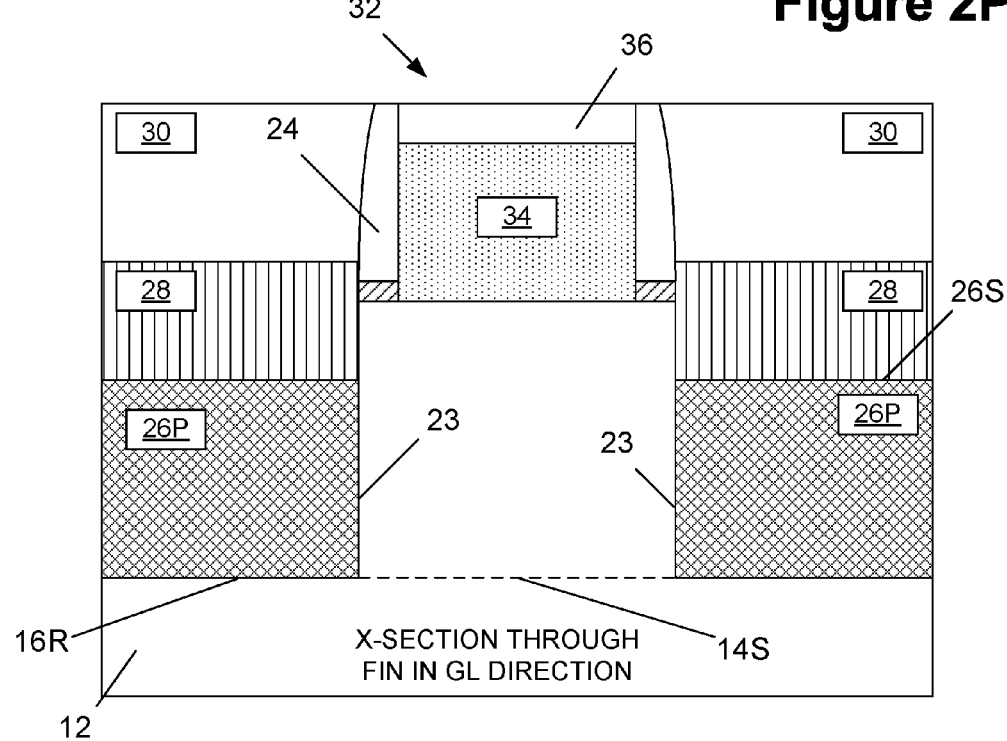
Figure 2Q:
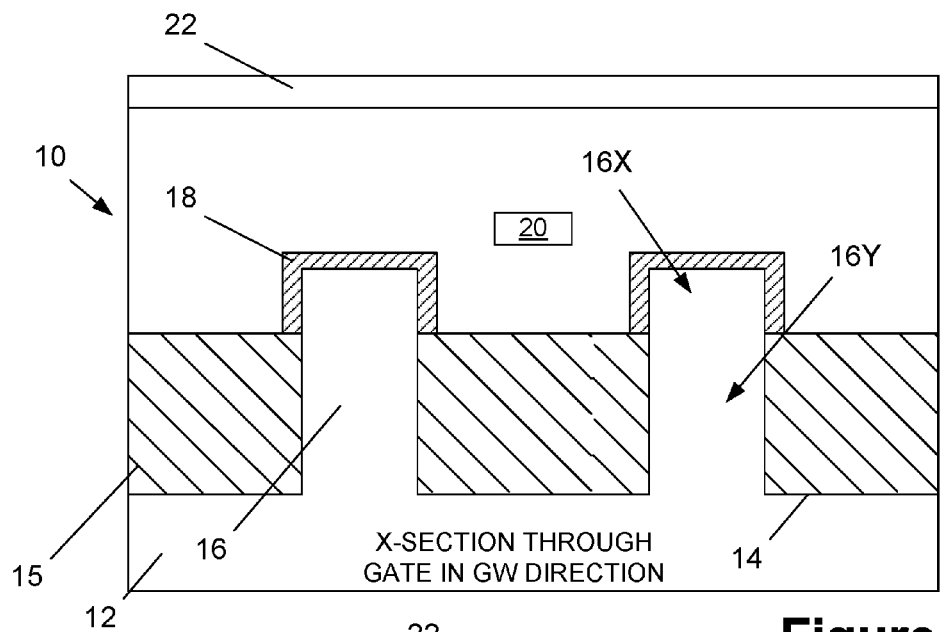
Figure 2Q:
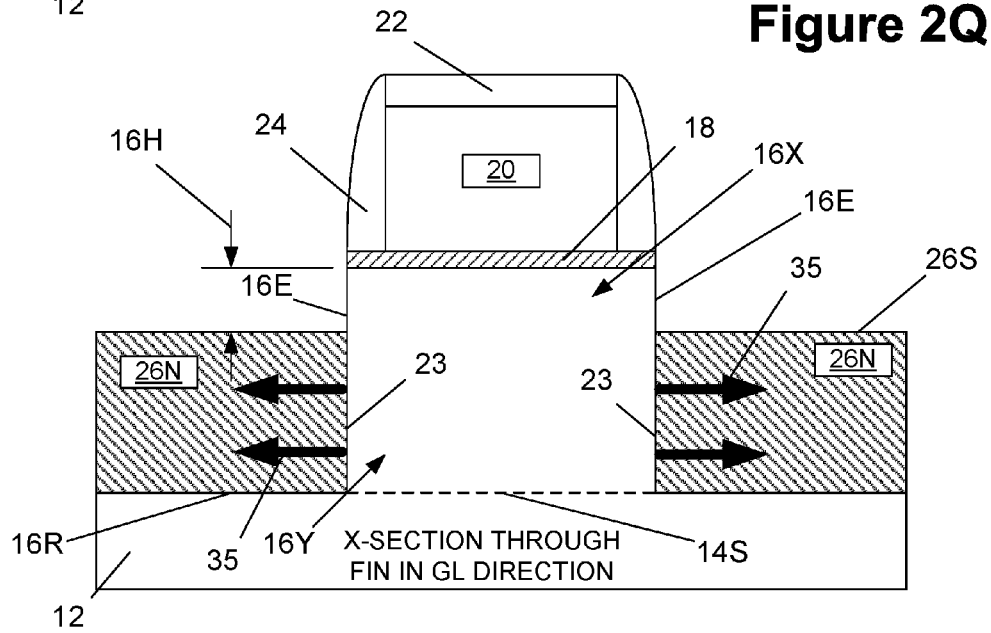
Figure 2R:
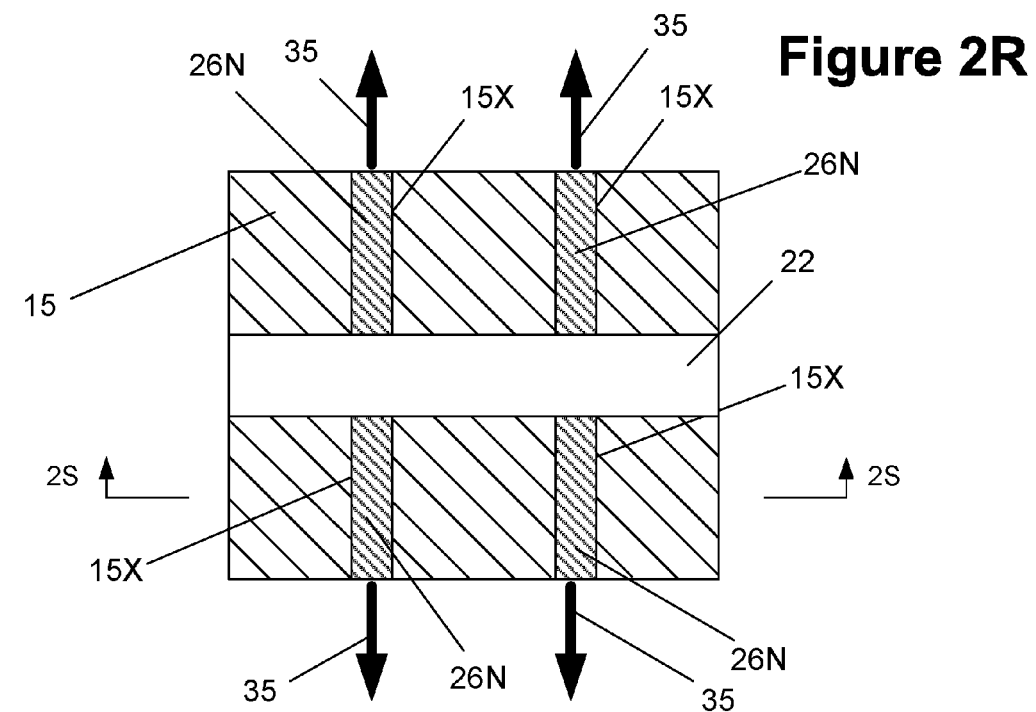
Figure 2S:
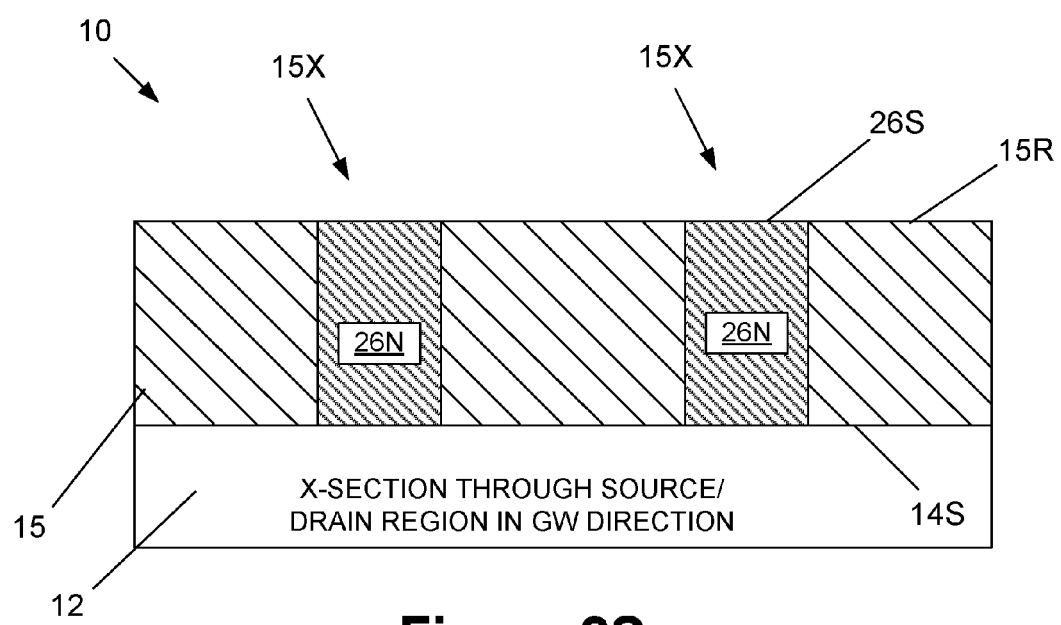
Figure 2T:
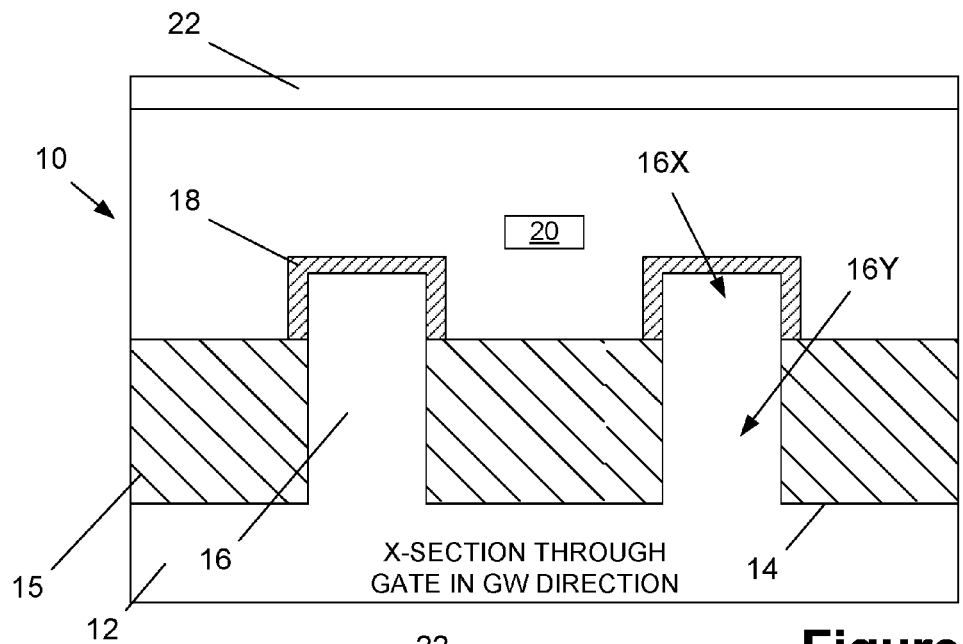
Figure 2T:
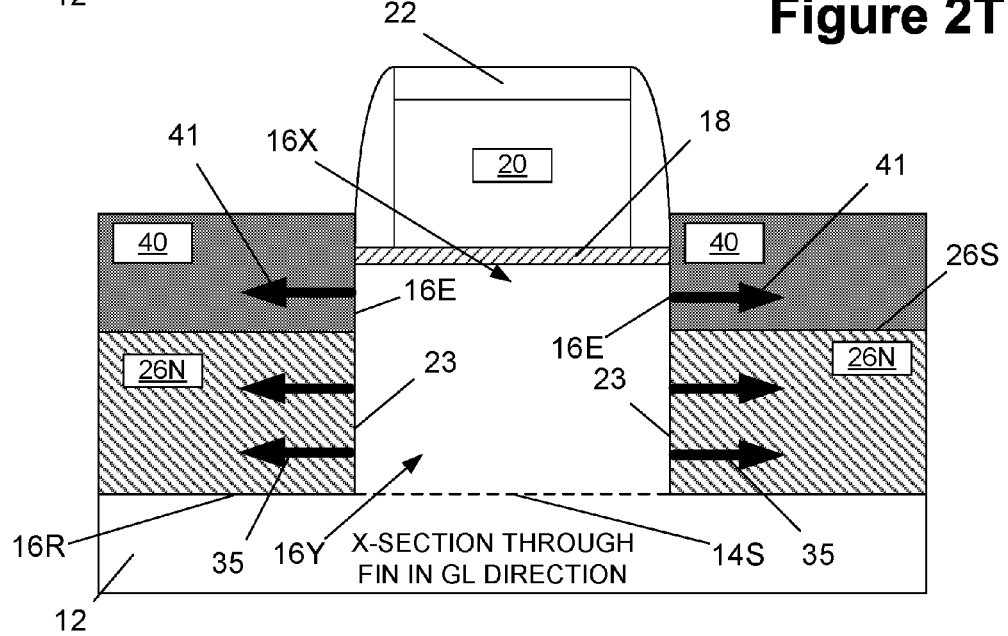
Figure 2W:
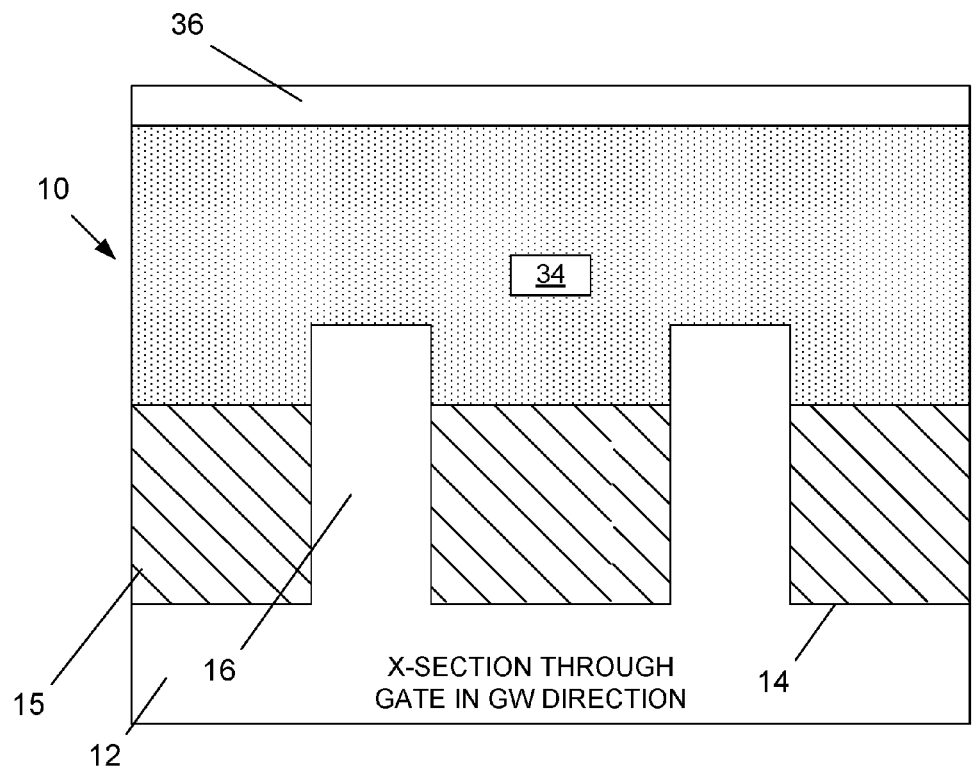
Figure 2W:
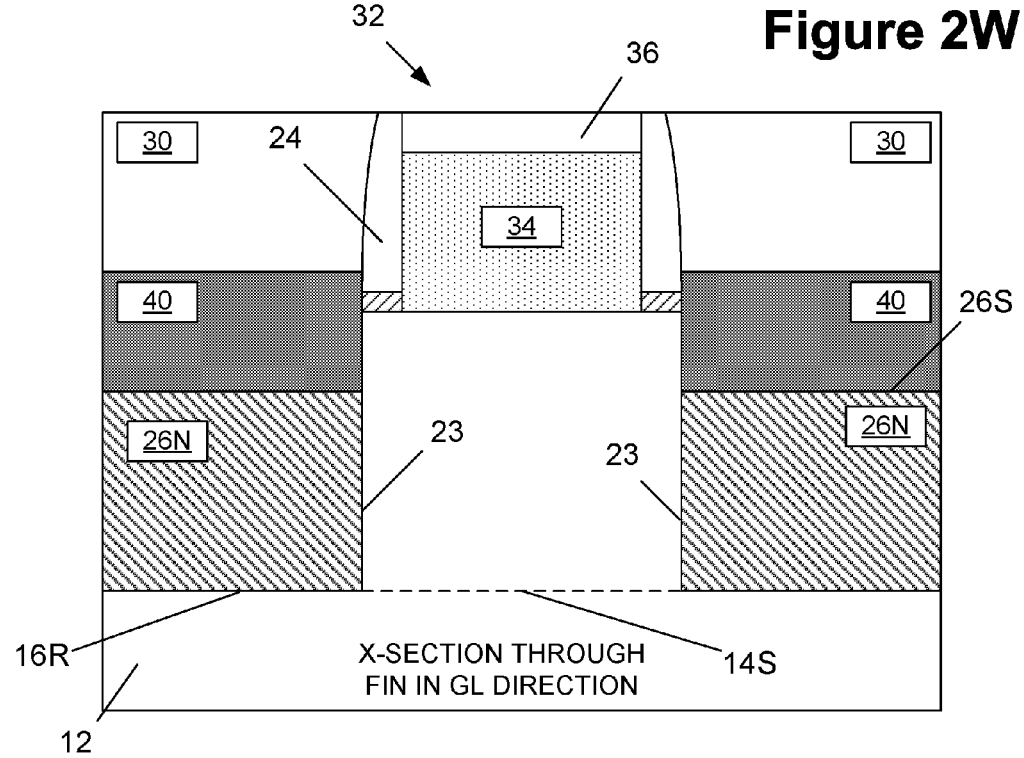

FIGS. 2A-2W depict various illustrative novel methods disclosed herein for forming strained channel regions on FinFET devices. Of course, the integrated circuit depicted herein may also include other type of FET devices, such as planar FETs. In general, many of the drawing sheets contain two different views—the upper view being a cross-sectional view taken through the gate in a gate width (GW) direction of the device, while the lower view in the drawing is a view taken through one of the fins 16 along the axial length of the fin 16, i.e., in a direction that corresponds to gate length (GL) of the device, i.e., the direction of current transport when the device 10 is operational. Additional cross-sectional views are also depicted in some of the drawings and they will be described more fully below. With reference to FIG. 2A, the product 10 depicted herein will be formed above a semiconductor substrate 12 comprised of a semiconductor material, such as, for example, a bulk silicon substrate. Thus, the terms "substrate," "semiconductor substrate" or "semiconducting substrate" should be understood to cover all semiconductor materials.

FIG. 2A depicts the product 10 after one or more etching processes, e.g., anisotropic etching processes, were performed through a patterned fin-formation etch mask 13 to form a plurality of fin-formation trenches 14 and thereby define a plurality of overall fin structures 16. The overall fin structures 16 have a lateral width 16W and a height (that corresponds to the depth 14H of the trenches 14), both of which may vary depending upon the particular application. Additionally, the overall size, shape and configuration of the fin-formation trenches 14 and the overall fin structures 16 may vary depending on the particular application. In the examples depicted herein, the initial depth 14H of the fin formation trenches 14 may be significantly deeper than the depth of traditional fin formation trenches for reasons that will be explained more fully below. For example, in one illustrative embodiment, the depth 14H may be on the order of about 100-150 nm, although such dimensions may vary depending upon the particular application. The lateral width 16W of the fins 16 (in the current transport direction) may also vary depending upon the particular application, e.g., 8-15 nm. The dimension 16H indicates the target height for the final exposed fin height for the fins 16 once the product 10 completed. In one illustrative embodiment, the dimension 16H may be on the order of about 35-45 nm. The overall fin 16 comprises channel portions 16X (with height 16H) that will be positioned under the gate structure (not shown) that will become a strained channel region for the FinFET device and lower portions 16Y positioned under the channel portions 16X.

In the illustrative examples depicted in the attached drawings, the fin-formation trenches 14 and the fins 16 are all depicted as having a uniform size and shape. However, such uniformity in the size and shape of the trenches 14 and the fins 16 is not required to practice at least some aspects of the inventions disclosed herein. In the attached figures, the fin-formation trenches 14 are depicted as having been formed by performing an anisotropic etching process that results in the overall fin structures 16 having a schematically (and simplistically) depicted, generally rectangular configuration. In an actual real-world device, the sidewalls of the fins 16 may be somewhat outwardly tapered (i.e., the fins may be wider at the bottom of the fin than they are at the top of the fin) although that configuration is not depicted in the attached drawings. Thus, the size and configuration of the trenches 14 and the fins 16, and the manner in which they are made, should not be considered a limitation of the present invention. For ease of disclosure, only the substantially rectangular trenches 14 and fins 16 will be depicted in the subsequent drawings. Moreover, the FinFET devices may be formed with any desired number of fins 16. The patterned fin-formation etch mask 13 may be comprised of a single layer or multiple layers of material. In one example, the patterned fin-formation etch mask 13 may be comprised of a so-call pad oxide layer that is positioned on top of the substrate 12 and a so-called pad nitride layer that is positioned on top of the pad oxide layer.

FIG. 2B depicts the product 10 after several process operations were performed. First, a layer of insulating material 15 (e.g., silicon dioxide) was deposited so as to overfill the fin-formation trenches 14 and the fin-formation etch mask 13. Then, at least one process operation, such as an optional chemical mechanical polishing (CMP) process, was performed to planarize the upper surface of the layer of insulating material 15 using the fins 16 as a polish-stop. This process operation removes the fin-formation etch mask 13 and exposes the upper surface 16S of the fins 16. Next, a timed, recess etching process was performed to recess the layer of insulating material 15 such that it has a recessed upper surface 15R that exposes the target final fin height 16H for the fins 16, i.e., this process exposes the channel portions 16X.

FIG. 2C depicts the device 10 after a gate insulation layer 18 (for a final gate structure or a replacement gate structure) was formed on the exposed channel portions 16X of the fins 16. In one illustrative embodiment, the gate insulation layer 18 may be a layer of silicon dioxide that was formed by performing an thermal growth process. The thickness of the gate insulation material 18 may vary depending upon the particular application.

FIG. 2D depicts the product 10 after two illustrative and representative gate electrodes 20 and gate cap layers 22 were formed above the layer of insulation material 18 and around the exposed channel portion 16X of the fins 16. The upper view in FIG. 2D is taken through only one of the gate electrode structures 20. As noted above, the gate insulation layer 18 may be comprised of a variety of different materials, such as, for example, silicon dioxide, a so-called high-k (k greater than 10) insulation material (where k is the relative dielectric constant), etc. Similarly, the gate electrode 20 may also be of a material such as polysilicon or amorphous silicon, or it may be comprised of one or more metal layers that act as the gate electrode 20. As will be recognized by those skilled in the art after a complete reading of the present application, the gate insulation layer 18 and the gate electrode 20 are intended to be representative in nature. That is, they may be comprised of a variety of different materials and they may have a variety of configurations. The gate insulation layer 18 and the gate electrodes 20 may be part of either dummy gate structures (for use when using "replacement gate" manufacturing techniques) or they may be part of final gate structures for the completed product. Also depicted in FIG. 2D is an illustrative gate cap layer 22, e.g., silicon nitride, that was formed above each of the gate electrodes 20. The lateral width 21 and the pitch 17 between adjacent gate electrodes 20 may vary depending upon the particular application. In one illustrative example, the lateral width 21 may be on the order of about 15-30 nm while the pitch 17 may be on the order of about 45-90 nm.

FIG. 2E depicts the product 10 after a sidewall spacer 24 was formed proximate the gate electrode structures 20. The spacer 24 was formed by depositing a layer of spacer material (e.g., silicon nitride) and thereafter performing an anisotropic etching process. Collectively, the gate electrode 20, the gate cap layer 22 and the spacer 24 may be considered to be a gate structure 19 (which may also include portions of the gate insulation layer 18).

FIGS. 2F-2H depict further processing of the product 10. The lower view in FIG. 2F as well as the simplistic plan view in FIG. 2G depicts only a single gate structure 19 so as not to overly complicate the drawings. As shown therein, a timed, etching process was performed to remove at least a portion of the vertical height of the exposed portions of the fins 16 in the source/drain regions of the device, i.e., to remove portions of the fins 16 not covered by the gate structure 19 and the spacer 24. The removal of at least some of the total height of the exposed portions of the fins 16 in the source/drain regions results in the definition of a remaining portion 16Z of the overall fin structure 16. The remaining portion 16Z is positioned under the gate structure 19 and it comprises a channel portion 16X (with edges 16E) and a lower portion 16Y (with edges 23) positioned under the channel portion 16X. The fin removal etching process also results in the formation or definition of a plurality of fin cavities 15X (FIG. 2H) defined in the insulating material 15 in the source/drain regions of the device wherein the recessed surface 16R of the fins defines the bottom surface of the fin cavities 15X. In the depicted example, the depth of the fin cavities 15X corresponds approximately to the depth of the trenches 14 (note the bottom portion of FIG. 2F wherein the recessed surface 16R is approximately at the same level as the recessed surface 14S of the trenches 14. However, the depth of the fin cavities 15X and the trenches 14 need not be the same in all applications, e.g., only one-half of the exposed portions of the fins 16 in the source/drain region may be removed.

FIGS. 2I-2P depict the illustrative situation where the devices are PMOS devices. FIGS. 2I-2K depict the product 10 after an undoped semiconductor material 26P was formed in the fin cavities 15X. In one illustrative example, the upper surface 26S of the semiconductor material 26P may be positioned such that it is substantially level with the upper surface 15R (FIG. 2K) of the layer of insulating material 15 so that only the desired exposed channel region portion 16X (with an exposed height 16H) of the fin 16 is positioned above the level of the surface 26S. In one example, the semiconductor material 26P may be formed in such a manner that the upper surface 26S is an "as-formed" surface. In other applications, the semiconductor material 15 may be formed in a manner such that it initially overfills the cavities 15X and is thereafter subjected to an etch-back process to insure that the upper surface 26S is located at the desired height level. Note that the edges 16E of the channel portion 16X of the fin 16, i.e., the portion of the fin 16 positioned under the gate structure 19 and above the surface 26S of the material 26P are exposed after the formation of the semiconductor material 26P. The semiconductor material 26P may be comprised of a semiconductor material that is different from that of the substrate material 12. For example, the semiconductor material 26P may be made of silicon germanium having a germanium concentration greater than or equal to 50% ($Si_{(1-x)}Ge_x$ where "x" ranges from 0.5-0.95), such as $Si_{0.25}Ge_{0.75}$ or $Si_{0.50}Ge_{0.50}$, a substantially pure germanium, or an III-V material, etc. \The semiconductor material 26P may be formed by performing an epitaxial growth process, and it may have a thickness that corresponds approximately to the depth of the fin cavities 15X. When it is stated herein and in the appended claims that a semiconductor material, such as the material 26P is "undoped", it is to be understood to mean that the semiconductor material is not intentionally doped, but it still may contain residual doping up to and around $10 \times 10^{16}$ ions/cm$^3$). As depicted, in this particular example, the semiconductor material 26P imparts a compressive stress 29 on the edges 23 of the lower portion 16Y of the remaining portion 16Z of the fin 16. The magnitude of this compressive stress 29 may vary depending upon the particular application. Also note that the edges 16E of the channel portion 16X of the fin 16 are still free surfaces and are not subjected to the stress 29 as the edges 16E are not in contact with the semiconductor material 26P, i.e., the channel portion 16X of the fin 16 may remain substantially relaxed at this point in the process. However, due to the compressive stress 29 generated by the semiconductor material 26P on the lower portion 16Y of the fin 16 positioned below the channel portion 16X of the fin 16, the channel portion 16X of the fin 16 is now effectively positioned on a virtual substrate having a compressive stress.

FIGS. 2L-2N depict the product 10 after a second semiconductor material 28 was formed above the semiconductor material 26P. The thickness of the second semiconductor material 28 may vary depending upon the particular application, e.g., 40-50 nm, but it will normally be at least of sufficient thickness to cover the edges 16E of the channel portion 16X of the fin 16. As shown in FIG. 2N, the second semiconductor material 28 may have a substantially uniform, rectangular configuration or it may have a diamond-like configuration, as reflected by the dashed lines 28X. The second semiconductor material 28 may be comprised of a semiconductor material that has a different composition, e.g., a lower germanium concentration, than that of the semiconductor material 26P, wherein the concentration of germanium is optimized to enable a simpler downstream flow process, reduce contact resistance, and strengthen the strain induced by the layer 26P. The second semiconductor material 28 may be formed by performing an epitaxial growth process using the first semiconductor material 26P and the edges 16E of the channel portion 16X as growth surfaces. In one illustrative embodiment, the second semiconductor material 28 may be doped with a Group III material such as boron and indium. The Group III material may be introduced in situ when the material 28 is being formed or by way of implantation after the material 28 is formed. In one illustrative embodiment, the amount of Group III material (e.g., boron) in the second semiconductor material 28 may fall within the range of at least about $10^{21}$ ions/cm$^3$. In some applications, the amount of germanium in the second semiconductor material 28 may be optimized so as to maximize the amount of Group III material that can be retained within the second semiconductor material 28 in order to minimize contact resistance. As depicted, the second semiconductor material 28 imparts a compressive stress 31 on the edges 16E of the channel region portion 16X of the fin 16. The magnitude of this compressive stress 31 may vary depending upon the particular application. Also note that since the edges 16E of the channel portion 16X of the fin 16 are now covered by the second semiconductor material 28, i.e., since the edges 16E are no longer "free surfaces," the channel portion 16X of the fin 16 is subjected to the stress 31 from the second semiconductor material 28 and a significant portion of the stress 29 induced on the lower portion 16Y of the fin below the channel portion 16X of the fin 16 by the semiconductor material 26P.

In the illustrative example depicted herein, the devices are manufactured using replacement gate manufacturing techniques. Accordingly, FIG. 2O depicts the product after several process operations were performed. First, a layer of insulating material 30 (e.g., silicon dioxide) was deposited above the substrate. Then, one or more chemical mechanical polishing (CMP) processes were performed to planarize the upper surface of the layer of insulating material 30 with the upper surface of the gate electrode 20. This results in the removal of the gate cap layer 22. Thereafter, one or more etching processes were performed to remove the gate electrode 20 and the gate insulation layer 18 of the gate structure 19 so as to thereby define a replacement gate cavity 32 and expose the upper surface 16S and side surfaces of the channel portion 16X of the fin 16 within the gate cavity 32.

Next, as shown in FIG. 2P, an illustrative and representative replacement gate structure 34 and a gate cap layer 36 were formed for the PMOS devices. In one illustrative embodiment, the schematically depicted replacement gate structure 34 includes an illustrative gate insulation layer (not separately shown) and an illustrative gate electrode (not separately shown). The gate insulation layer may be comprised of a variety of different materials, such as, for example, silicon dioxide, a so-called high-k (k greater than 10) insulation material (where k is the relative dielectric constant), etc. Similarly, the replacement gate electrode may also be of a material such as polysilicon or amorphous silicon, or it may be comprised of one or more metal layers that act as the gate electrode. As will be recognized by those skilled in the art after a complete reading of the present application, the replacement gate structure 34 is intended to be representative in nature. That is, the replacement gate structure 34 may be comprised of a variety of different materials and it may have a variety of configurations.

FIGS. 2Q-2W depict the illustrative situation where the devices are NMOS devices. Starting at a point in the process flow after the formation of the fin cavities 15X (see FIGS. 2F and 2H), FIGS. 2Q-2S depict the product 10 after an undoped semiconductor material 26N was formed in the fin cavities 15X. In one illustrative example, the upper surface 26S of the semiconductor material 26N may be positioned such that it is substantially level with the upper surface 15R of the layer of insulating material 15 (FIG. 2S) so that only the desired exposed channel region portion 16X (with an exposed height 16H) of the fin 16 is positioned above the level of the surface 26S. As noted above, the surface 26S may be an "as-formed" surface or it may be a surface after an etch-back process was performed on the material 26N. Note that the edges 16E of the channel portion 16X of the fin 16, i.e., the portion of the fin 16 positioned under the gate structure 19 and above the surface 26S of the material 26P are exposed after the formation of the first semiconductor material 26N. The first semiconductor material 26N may be comprised of a semiconductor material that is different from that of the substrate material 12. For example, the first semiconductor material 26N may be made of silicon-carbon having a carbon concentration of 2-4% or greater. The first semiconductor material 26N may be formed by performing an epitaxial growth process, and it may have a thickness that corresponds approximately to the depth of the fin cavities 15X. As depicted, the first semiconductor material 26N imparts a tensile stress 35 on the edges 23 of the lower portion 16Y of the fin 16 that is positioned under the channel region portion 16X of the fin 16. The magnitude of this tensile stress 35 may vary depending upon the particular application. Also note that the edges 16E of the channel portion 16X of the fin 16 are still free surfaces and are not subjected to the stress 35 as the edges 16E are not in contact with the semiconductor material 26N, i.e., the channel portion 16X of the fin 16 may be substantially unstrained at this point in the process. However, due to the tensile stress 35 generated by the semiconductor material 26N on the portions of the fin 16 positioned below the channel portion 16X of the fin 16, the channel portion 16X of the fin 16 is now effectively positioned on a virtual substrate having a tensile stress.

FIGS. 2T-2V depict the product 10 after a second semiconductor material 40 was formed above the first semiconductor material 26N. The thickness of the second semiconductor material 40 may vary depending upon the particular application, e.g., 40-50 nm, but it will normally be of sufficient thickness to cover the edges 16E of the channel portion 16X of the fin 16. The second semiconductor material 40 may be comprised of a semiconductor material that has a different composition, e.g., a lower carbon concentration, than that of the semiconductor material 26N, wherein the concentration of carbon is optimized to enable a simpler downstream flow process, reduce contact resistance, and strengthen the strain induced by the layer 26N. For example, in one illustrative embodiment, the second semiconductor material 40 may be comprised of a silicon-carbon material having a carbon concentration of less than 0.5%. The second semiconductor material 40 may be formed by performing an epitaxial growth process using the material 26S and the edges 16E as growth surfaces. As shown in FIG. 2V, the semiconductor material 40 may have a substantially uniform, rectangular configuration or it may have a diamond-like configuration, as reflected by the dashed lines 40X. In one illustrative embodiment, the second semiconductor material 40 may be doped with a Group V material, such as phosphorous, arsenic, antimony, etc. The Group V material (e.g., phosphorous) may be introduced in situ when the material 40 is being formed or by way of implantation after the material 40 is formed. In one illustrative embodiment, the amount of the Group V material in the second semiconductor material 40 may fall within the range of at least about $10^{21}$ ions/cm$^3$. In some applications, the amount of carbon in the second semiconductor material 40 may be optimized so as to maximize the amount of phosphorous that can be retained within the second semiconductor material 40 in order to minimize contact resistance. As depicted, the second semiconductor material 40 imparts a tensile stress 41 on the edges 16E of the channel region portion 16X of the fin 16. The magnitude of this tensile stress 41 may vary depending upon the particular application. Also note that since the edges 16E of the channel portion 16X of the fin 16 are now covered by the second semiconductor material 40, i.e., since the edges 16E are no longer "free surfaces," the channel portion 16X of the fin 16 is subjected to the tensile stress 41 from the second semiconductor material 40 as well as a significant portion of the tensile stress 35 induced on the lower portion 16Y of the fin below the channel portion 16X of the fin 16 by the semiconductor material 26N.

As noted above, in the illustrative example depicted herein, the devices are manufactured using replacement gate manufacturing techniques. Accordingly, FIG. 2W depicts the product after several process operations were performed as generally described with respect to FIGS. 2O-2P above which result in the formation of the representative replacement gate structure 34, as shown in FIG. 2W. Of course, the materials of construction for the replacement gate structure 34 for the NMOS devices may be different from the materials of construction for the replacement gate structure 34 for the PMOS devices.

Figure 3A:
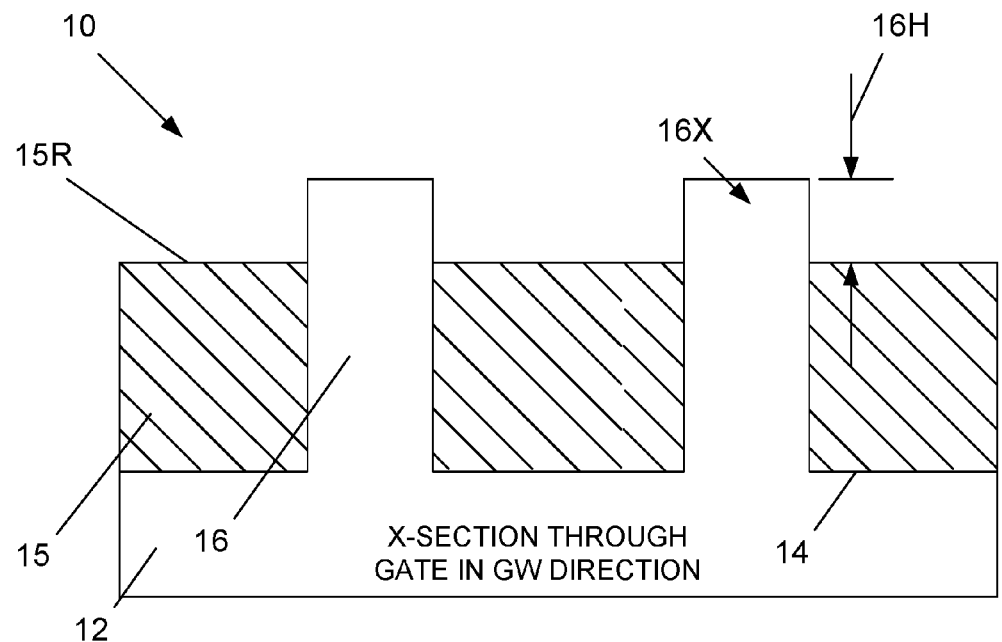
FIGS. 3A-3S depict yet other illustrative novel methods disclosed herein for forming strained channel regions on FinFET devices by performing a heating process on a heat-expandable material.
Figure 3A:
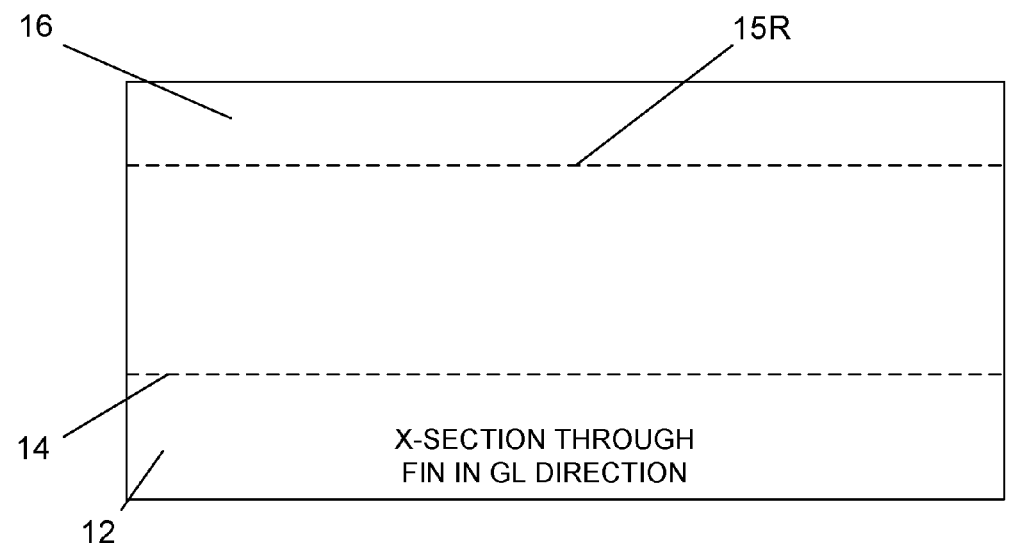
Figure 3B:
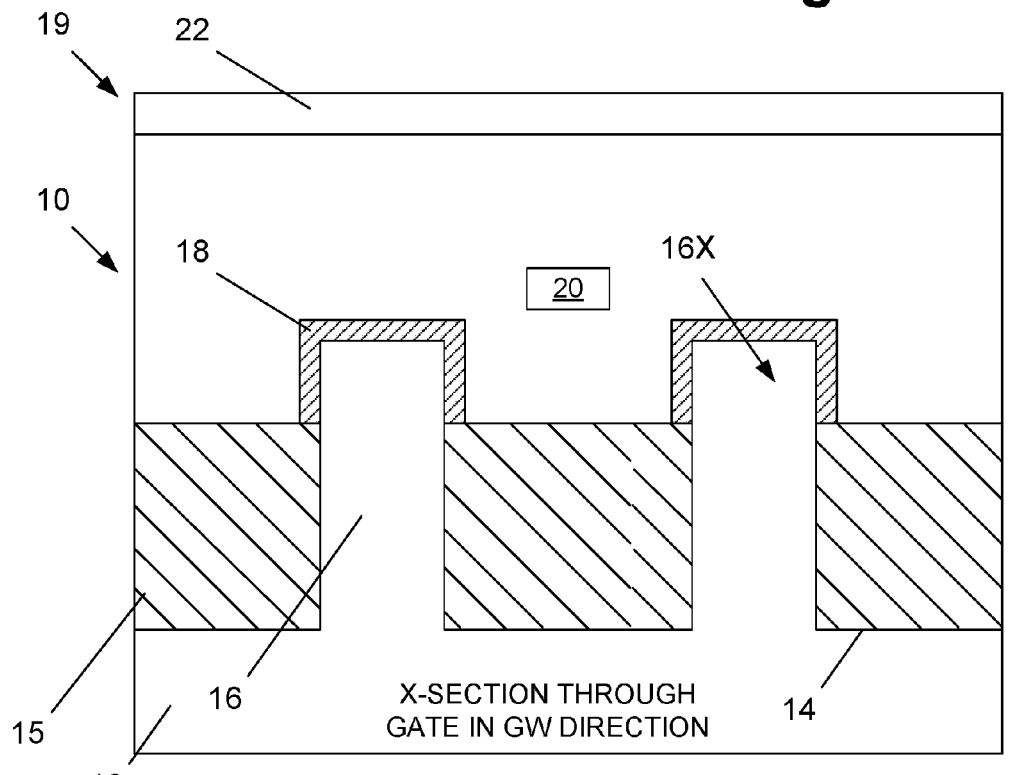
Figure 3B:
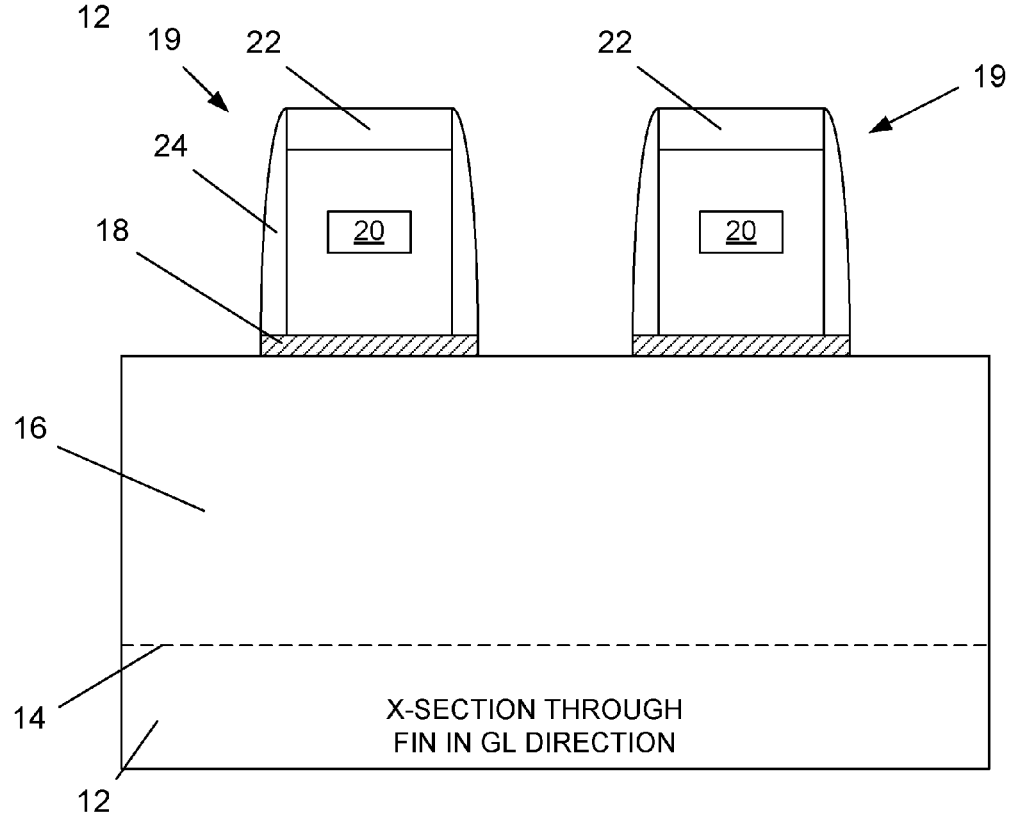
Figure 3C:
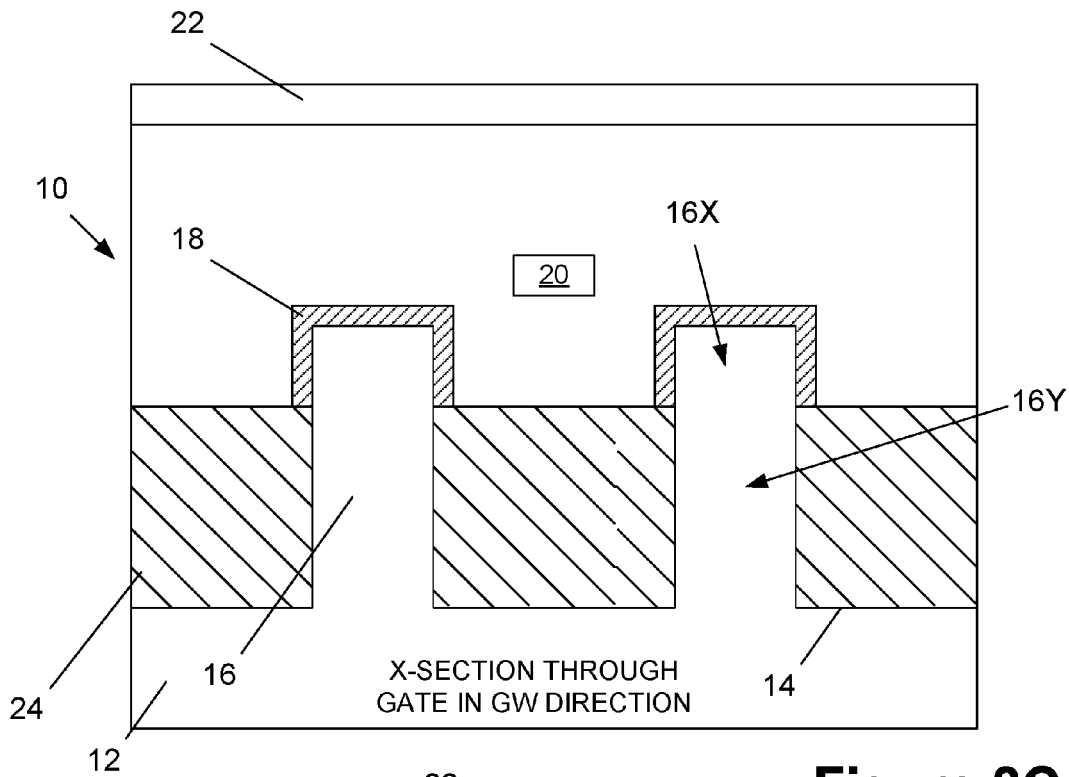
Figure 3C:
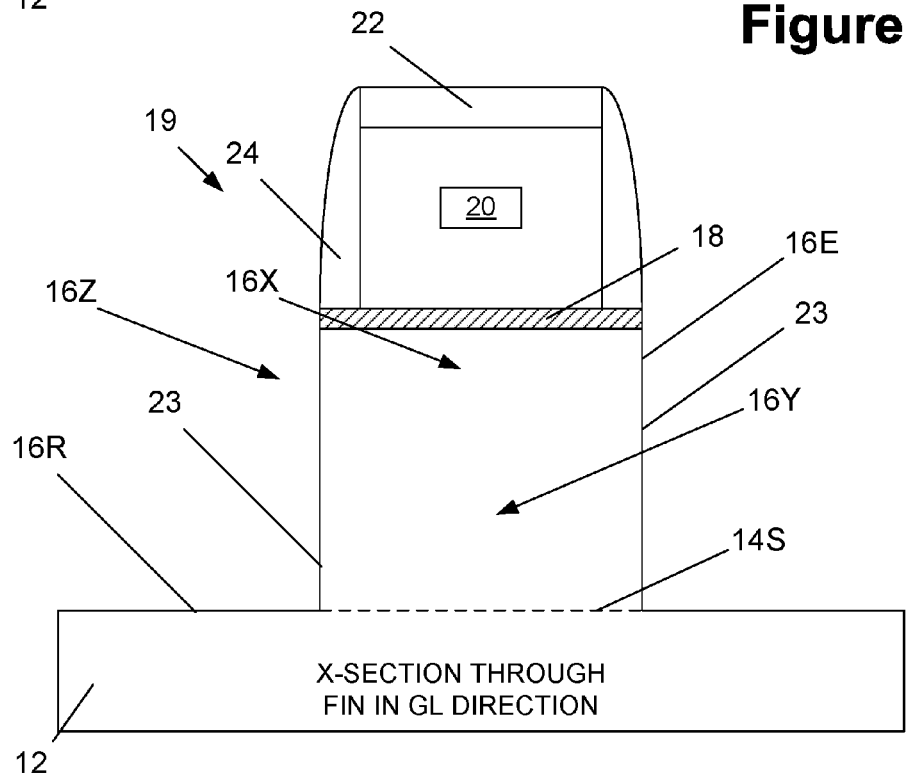
Figure 3G:
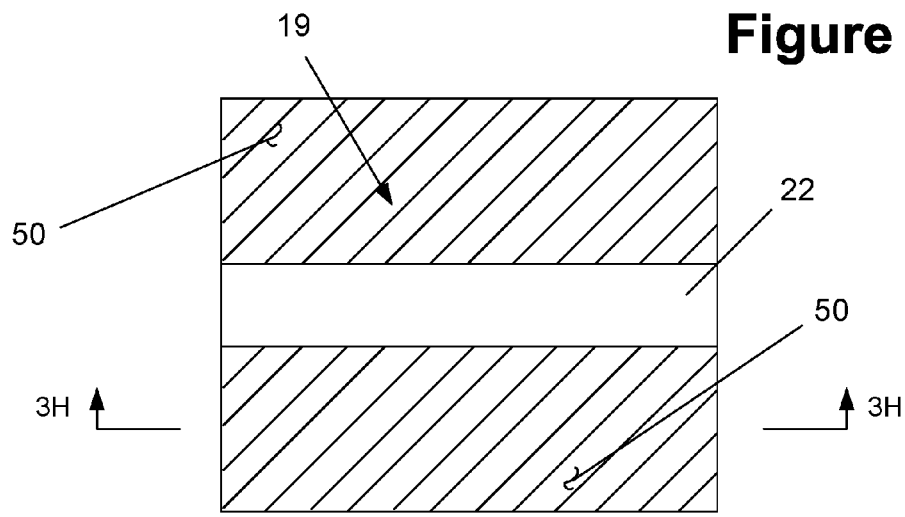
Figure 3H:
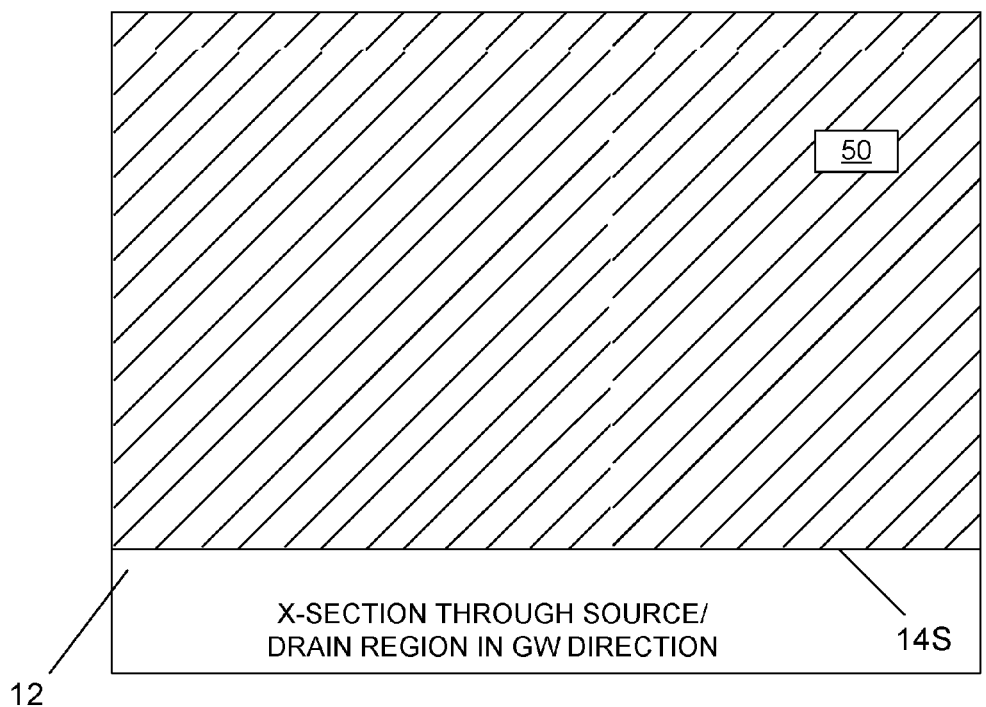
Figure 3J:
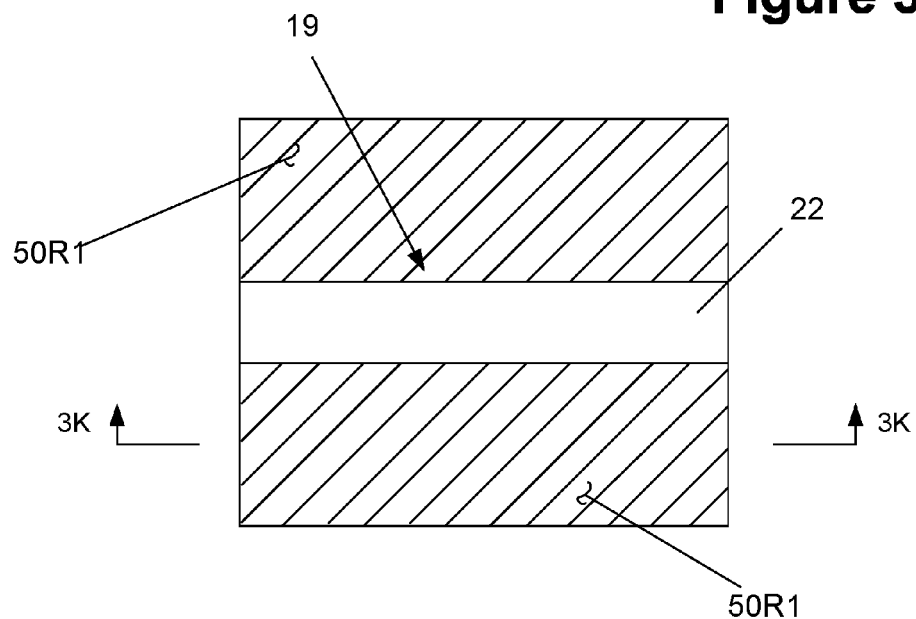
Figure 3K:
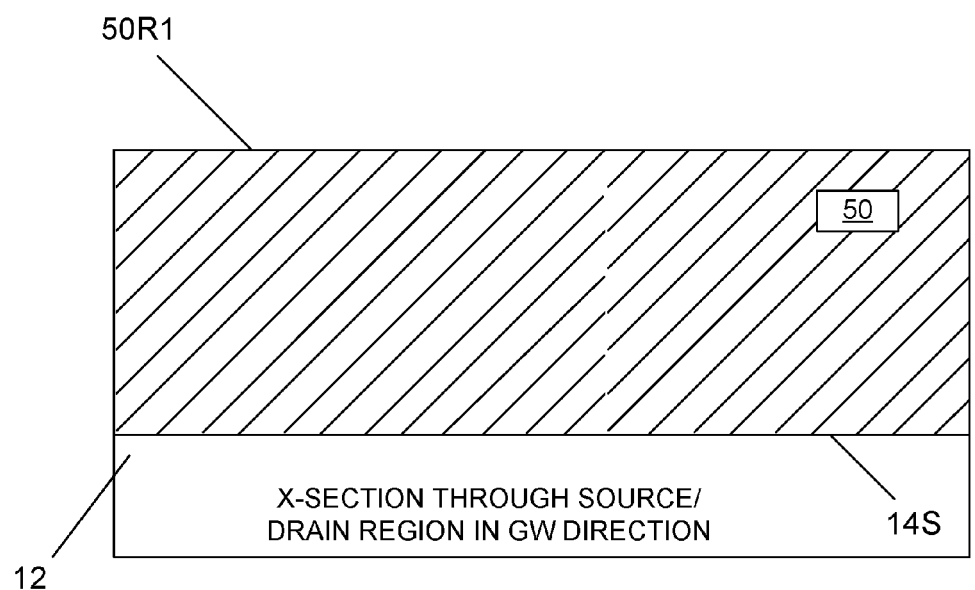
Figure 3L:
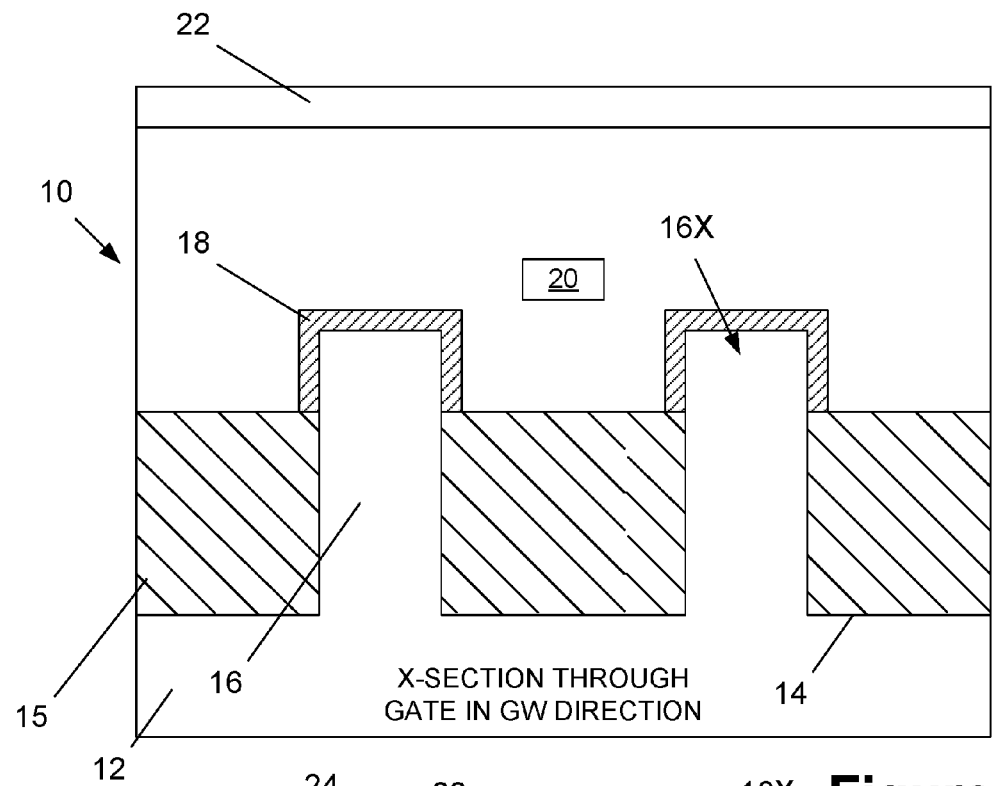
Figure 3L:
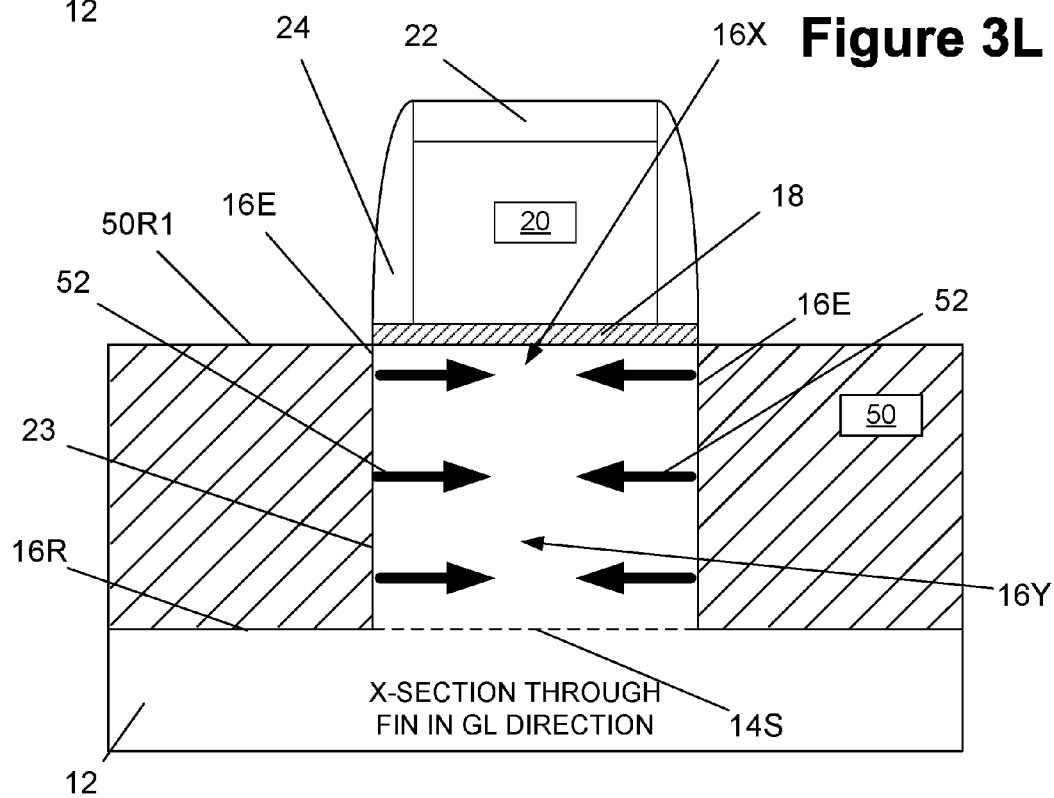
Figure 3M:
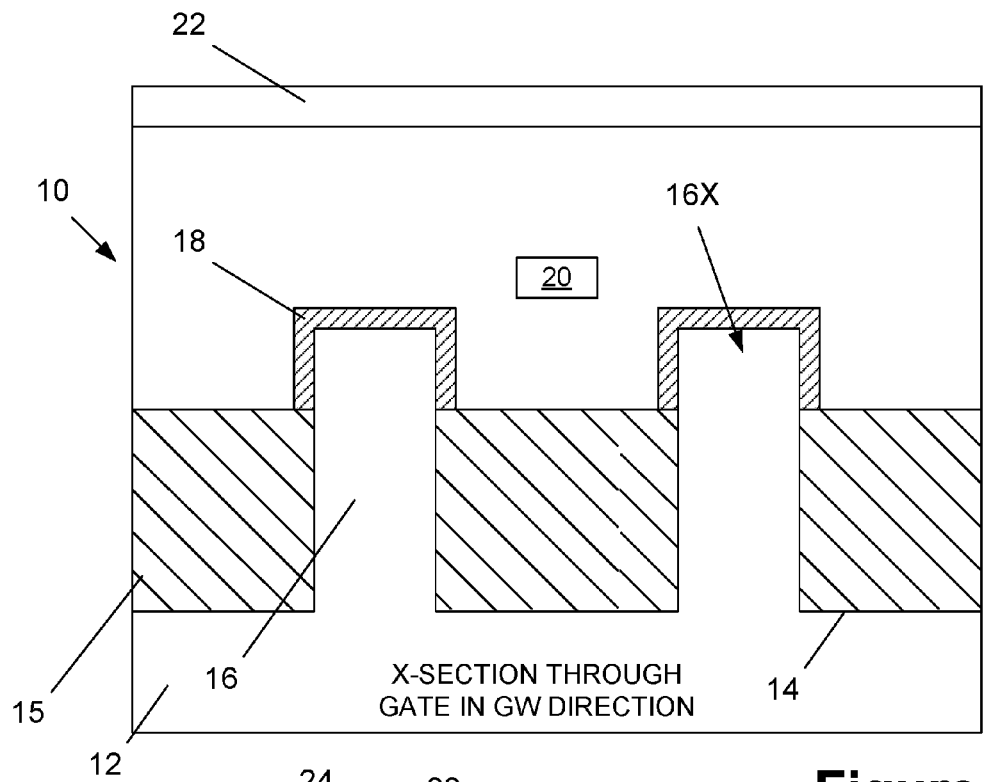
Figure 3M:
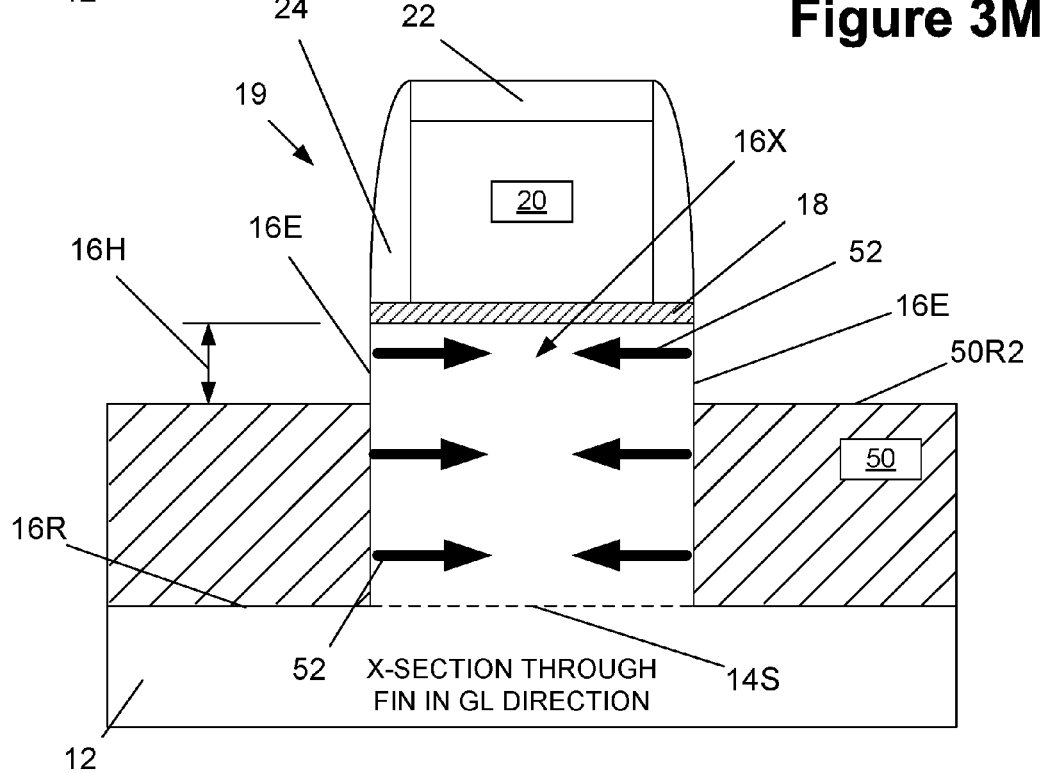
Figure 3N:
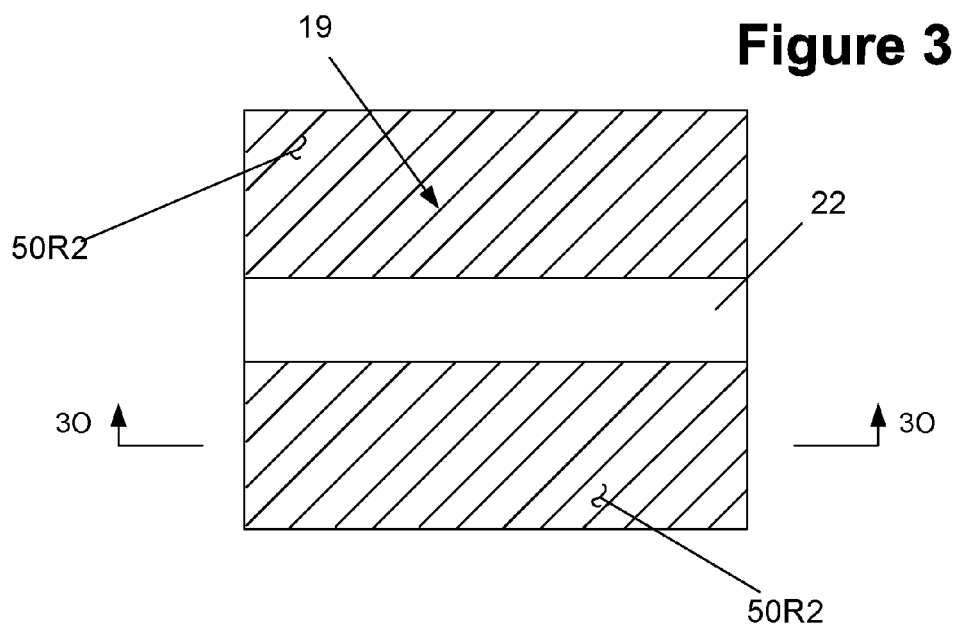
Figure 3O:
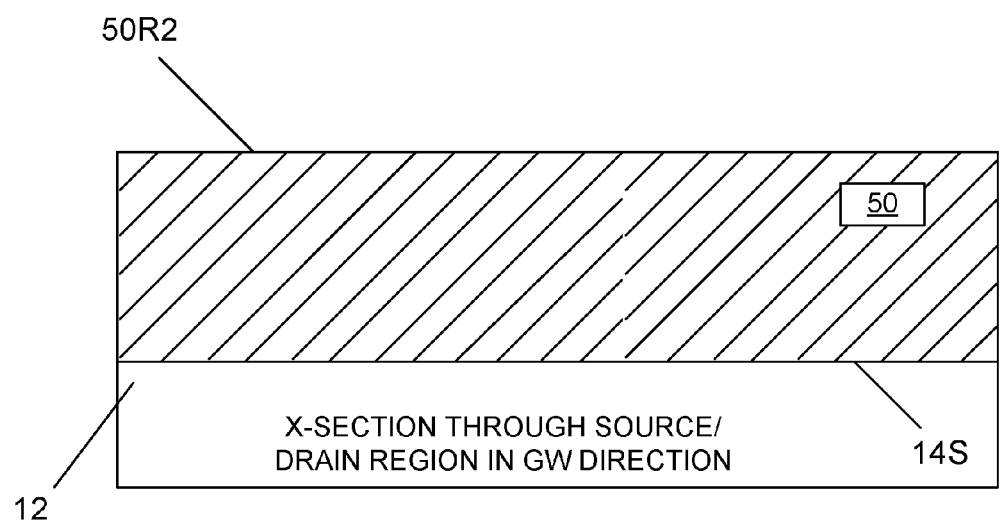
Figure 3P:
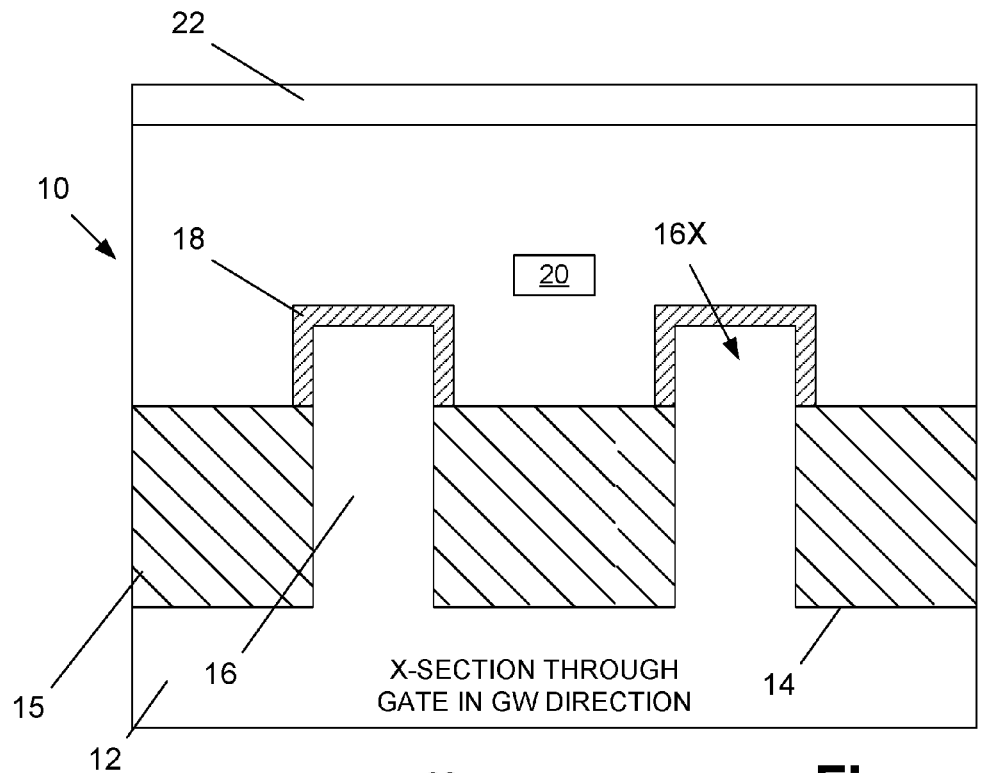
Figure 3P:
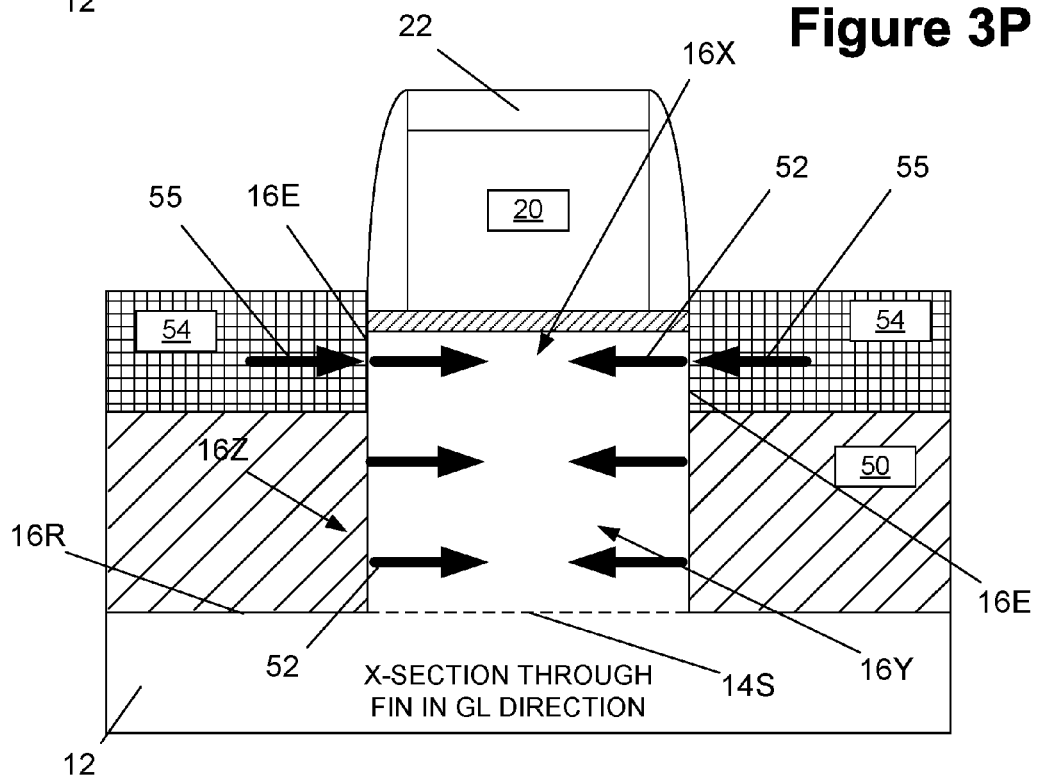
Figure 3Q:
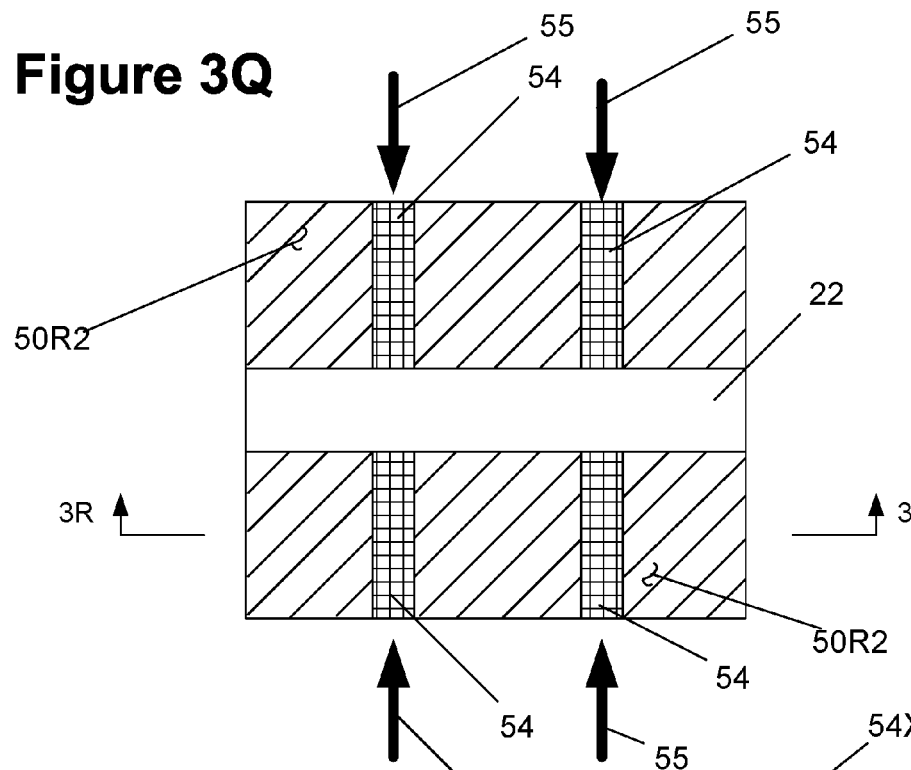
Figure 3R:
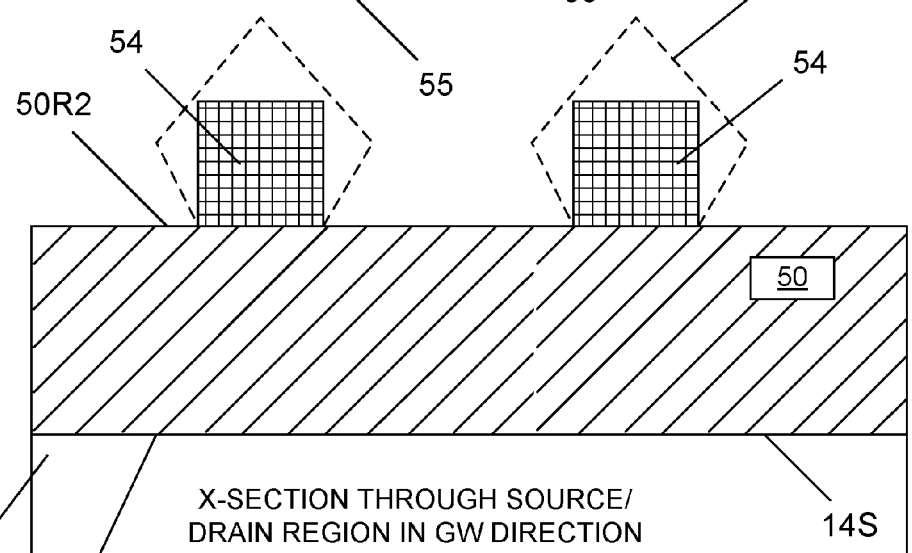
Figure 3S:
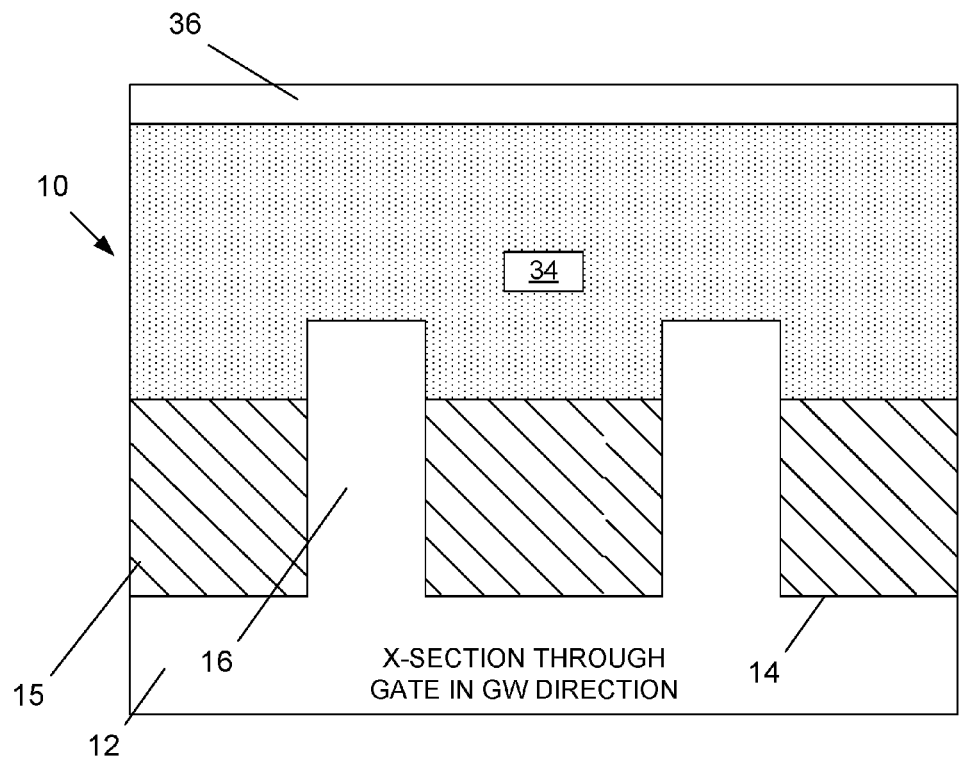
Figure 3S:
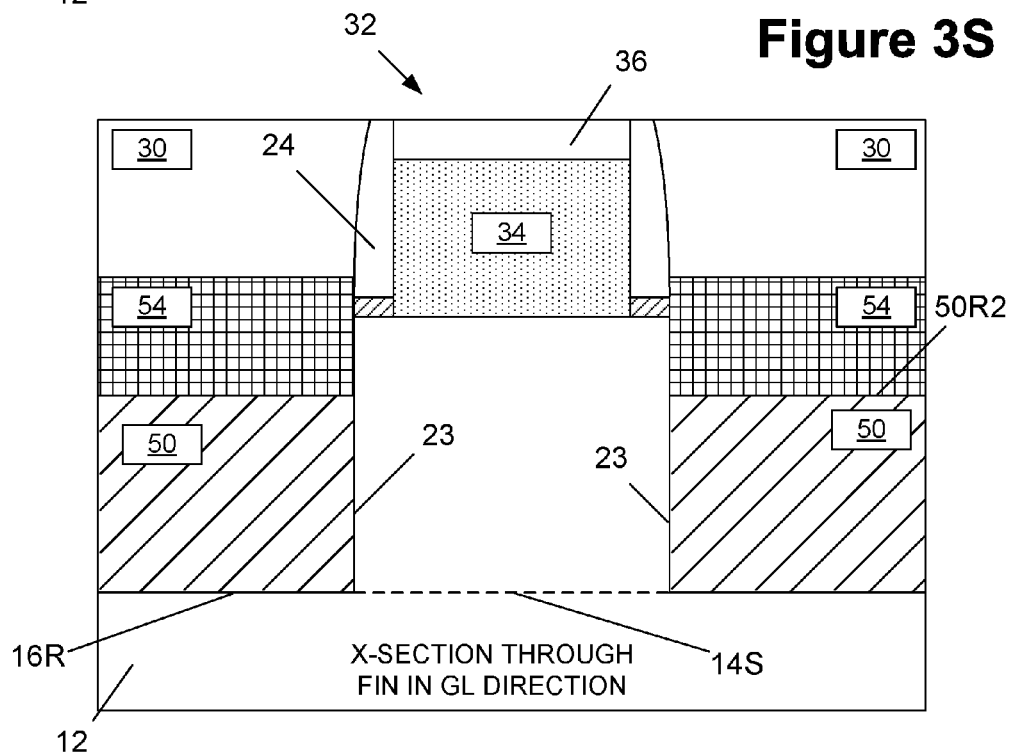

FIGS. 3A-3S depict yet other illustrative novel methods disclosed herein for forming strained channel regions on FinFET devices by performing a heating process on a heat-expandable material. FIG. 3A depicts the product 10 at a point in fabrication that corresponds to that shown in FIG. 2A, i.e., after formation of the deep trenches 14, the fins 16 and the layer of insulating material 15 having the recessed upper surface 15R that exposes the desired height 16H (channel portions 16X) of the fins 16.

FIG. 3B depicts the product 10 after the above-described gate structures 19 (including the sidewall spacer 24 and the gate cap layer 22) were formed above the channel portions 16X of the fins 16 and the recessed layer of insulating material 15.

FIGS. 3C-3E depict the product 10 after further processing was performed on the product. The lower view in FIG. 3C as well as the simplistic plan view in FIG. 3D depict only a single gate structure 19 so as not to overly complicate the drawings. As shown in these drawings, a timed, fin removal etching process was performed to remove at least a portion of the vertical height of the portions of the fins 16 in the source/drain regions of the device, i.e., to remove at least a portion of the vertical height of the exposed portions of the fins 16 not covered by the gate structure 19. In one embodiment, the fin removal etching process was performed with the insulating material 15 in position in the trenches 14 in the source/drain regions of the devices. As with the above embodiment, the removal of at least some of the total height of the exposed portions of the fins 16 in the source/drain regions results in the definition of the remaining portion 16Z of the overall fin structure 16 under the gate structure 19. In the depicted example, the exposed portions of the fins 16 in the source/drain regions were recessed to a depth that is approximately equal to the depth of the trenches 14 (note the bottom portion of FIG. 3C wherein the recessed surface 16R of the fin is approximately at the same level as the recessed surface 14S of the trenches 14). However, the exposed portions of the fins 16 in the source/drain regions need not be recessed to a depth substantially equal to the trenches 14 in all applications, i.e., less than the entire vertical height of the exposed portions of the fins 16 in the source/drain regions may be removed. Additionally, in one embodiment, after the fin removal etching process was performed, another etching process was performed to remove substantially all of the exposed portions of the insulating material 15 positioned in the trenches 14 in the source/drain regions of the device that are not covered by the gate structure 19.

FIGS. 3F-3H depict the product 10 after a layer of heat-expandable material 50 (e.g., silicon dioxide, silicon nitride, silicon oxynitride) with desired thermal expansion properties was deposited so as to overfill the fin-formation trenches 14. Then, an optional chemical mechanical polishing (CMP) process was performed to planarize the upper surface of the layer of heat-expandable material 50 with the gate cap layers 22. In one illustrative embodiment, the layer of heat-expandable material 50 may be comprised of any material having a coefficient of thermal expansion that is substantially different than the materials used for the fins 16, e.g., a coefficient of thermal expansion that is substantially different than that of the semiconductor substrate.

FIGS. 3I-3K depict the product 10 after a first timed, recess etching process was performed so as to recess the layer of heat-expandable material 50 such that it has a recessed upper surface 50R1 that, in the depicted example, is approximately level with the upper surface 16S of the channel portion 16X of the remaining portion 16Z of the overall fin structure 16. However, it should be noted that, in some applications, the layer of heat-expandable material 50 need not be recessed to the level reflected by the recessed surface 50R1 prior to performing the heat treatment process described below, i.e., the heat treatment process described below could be performed without recessing the layer of heat-expandable material 50 at all or at least not recessing the layer 50 to the degree depicted in FIG. 3I.

FIG. 3L depicts the product 10 after a heat treatment process was performed on the product so as to cause the layer of heat-expandable material 50 to expand and generate a compressive stress 52 on the fin 16, including the channel portion 16X of the fin 16. In one illustrative embodiment, the heat treatment may be performed at a temperature that falls within the range of about 500-1200° C. for a duration that may fall within the range of about 1 minute to two hours. The magnitude of the compressive stress 52 may vary depending upon the particular application. Also note that the edges 16E of the channel portion 16X of the fin 16 are subjected to the compressive stress 52 since the edges 16E are in contact with the layer of heat-expandable material 50 as it expands during the heat treatment process. The edges 23 of the lower portion 16Y of the remaining portion 16Z of the overall fin structure 16 are also subjected to this stress 52.

FIGS. 3M-3O depict the product 10 after a second timed, recess etching process was performed so as to further recess the layer of heat-expandable material 50 such that it has a second recessed upper surface 50R2 that exposes the edges 16E of the channel portion 16X of the fin 16 for a desired height 16H. Even though the layer of heat-expandable material 50 has been recessed so as to expose the edges 16E of the channel portion 16X of the fin 16, there may still be some residual compressive stress 52 present in the channel portion 16X of the fin 16 at this point in the process flow.

FIGS. 3P-3R depict the product 10 after an epitaxial growth process was performed to form a semiconductor material 54 above the recessed layer of heat-expandable material 50 using the exposed edges 16E of the channel portion 16X of the fin 16 as a growth surface. The thickness of the semiconductor material 54 may vary depending upon the particular application, e.g., 40-50 nm, but it will normally be of sufficient thickness to cover the edges 16E of the channel portion 16X of the fin 16. As shown in FIG. 3R, the semiconductor material 54 may have a substantially uniform, rectangular configuration or it may have a diamond-like configuration, as reflected by the dashed lines 54X. The semiconductor material 54 may be comprised of silicon germanium ($Si_{(1-x)}Ge_x$ where "x" ranges from 0.35-0.75), a substantially pure germanium, or a III-V material, etc. In one illustrative embodiment, the semiconductor material 54 may be doped with a Group III material such as boron or indium. The Group III material may be introduced in situ when the material 54 is being formed or by way of implantation after the material 54 is formed. In one illustrative embodiment, the amount of Group III material (e.g., boron) in the semiconductor material 54 may fall within the range of about $10^{21}$ ions/cm³. In some applications, the amount of germanium in the semiconductor material 54 may be optimized so as to maximize the amount of the Group III material that can be retained within the semiconductor material 54 so as to minimize contact resistance. As depicted in FIG. 3P, the semiconductor material 54 imparts a compressive stress 55 on the edges 16E of the channel region portion 16X of the fin 16. The magnitude of this compressive stress 55 may vary depending upon the particular application. Also note that since the edges 16E of the channel portion 16X of the fin 16 are now covered by the semiconductor material 54, i.e., since the edges 16E are no longer "free surfaces," the channel portion 16X of the fin 16 is subjected to at least some of the stress 52 induced on the lower portion 16Y of the remaining portion 16Z of the overall fin structure 16 by the expansion of the layer of heat-expandable material 50 when it was heated. Additionally, as noted above, the channel portion 16X of the fin 16 may also be subjected to a third source of compressive stress. That is, some residual compressive stress induced by the heat-expandable material layer 50 may be induced on the channel portion 16X even after the material layer 50 was recessed (such that it has a recessed upper surface 50R2) so as to expose the desired amount of the edges 16E of the channel portion 16X of the fin 16.

In the illustrative example depicted if FIG. 3S, the devices are manufactured using replacement gate manufacturing techniques. Accordingly, FIG. 3S depicts the product after several process operations were performed as generally described with respect to FIGS. 2O-2P above which result in the formation of the representative replacement gate structure 34, as shown in FIG. 3S.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of fin formation trenches in a semiconductor substrate so as to thereby define an overall fin structure having a vertical height;
    forming a layer of insulating material in said fin formation trenches, said layer of insulating material having an upper surface that is located so as to expose a portion of said overall fin structure;
    forming a gate structure above said layer of insulating material and around said exposed portion of said overall fin structure, said gate structure comprising at least one sidewall spacer and a gate cap layer;
    performing at least one first etching process to remove at least a portion of said vertical height of portions of said overall fin structure that are not covered by said gate structure so as to result in the definition of a remaining portion of said overall fin structure that is positioned under said gate structure wherein said remaining portion comprises a channel portion and a lower portion located under said channel portion;
    performing at least one second etching process to remove substantially all of said layer of insulating material that is not covered by said gate structure;
    forming a layer of heat-expandable material adjacent said remaining portion of said overall fin structure;
    performing a heating process on said layer of heat-expandable material so as to cause said layer of heat-expandable material to expand;
    after performing said heating process, recessing said layer of heat-expandable material such that it has a recessed upper surface that exposes edges of said channel portion of said remaining portion of said overall fin structure; and
    growing a semiconductor material above said recessed upper surface of said layer of heat-expandable material using said exposed edges of said channel portion as a growth surface.

2. The method of claim 1, wherein said layer of insulating material in said fin formation trenches comprises silicon dioxide.

3. The method of claim 1, wherein said layer of heat-expandable material comprises one of silicon nitride, silicon dioxide or silicon oxynitride.

4. The method of claim 1, wherein said layer of heat-expandable material comprises a material having a coefficient of thermal expansion that is substantially different than that of said semiconductor substrate.

5. The method of claim 1, wherein performing said heating process comprises performing said heating process at a temperature that falls within a range of about 500-1200° C. for a duration that falls within a range of 1 minute to two hours.

6. The method of claim 1, wherein said semiconductor material comprises silicon-germanium ($Si_{(1-x)}Ge_x$ where "x" ranges from 0.35-1) or a III-V material.

7. The method of claim 6, wherein said semiconductor material further comprises a Group III material wherein a concentration of said Group III material is at least about $10^{21}$ ions/cm$^3$.

8. The method of claim 1, wherein said fin formation trenches have a depth that falls within a range of about 100-150 nm.

9. The method of claim 1, wherein said semiconductor material is formed so as to induce a tensile stress on said channel portion.

10. The method of claim 1, wherein said performing said first etching process removes substantially the entire vertical height of said exposed portions of said overall fin structure.

11. The method of claim 1, further comprising, prior to performing said heating process, recessing said layer of heat-expandable material such that it has an upper surface that is positioned at a level that is at least equal to a level of an upper surface of said remaining portion of said overall fin structure.

12. A method, comprising:
    forming a plurality of fin formation trenches in a semiconductor substrate so as to thereby define an overall fin structure having a vertical height;
    forming a layer of insulating material in said fin formation trenches, said layer of insulating material having an upper surface that is located so as to expose a portion of said overall fin structure;
    forming a gate structure above said layer of insulating material and around said exposed portion of said overall fin structure, said gate structure comprising at least one sidewall spacer and a gate cap layer;
    performing at least one first etching process to remove at least a portion of said vertical height of portions of said overall fin structure that are not covered by said gate structure so as to result in the definition of a remaining portion of said overall fin structure that is positioned under said gate structure wherein said remaining portion comprises a channel portion and a lower portion located under said channel portion;

performing at least one second etching process to remove substantially all of said layer of insulating material that is not covered by said gate structure;

forming a layer of heat-expandable material adjacent said remaining portion of said overall fin structure;

performing a first recess etching process on said layer of heat-expandable material such that it has a first recessed upper surface that is positioned at a level that is equal to or above a level of an upper surface of said channel portion of said remaining portion of said overall fin structure;

after performing said first recess etching process, performing a heating process on said layer of heat-expandable material so as to cause said layer of heat-expandable material to expand;

after performing said heating process, performing a second recess etching process on said layer of heat-expandable material such that it has a second recessed upper surface that exposes edges of said channel portion of said remaining portion of said overall fin structure; and growing a semiconductor material above said second recessed upper surface of said layer of heat-expandable material using said exposed edges of said channel portion as a growth surface, wherein said grown semiconductor material covers said exposed edges of said channel portion.

13. The method of claim 12, wherein said layer of heat-expandable material comprises a material having a coefficient of thermal expansion that is substantially different than that of said semiconductor substrate.

14. The method of claim 12, wherein performing said heating process comprises performing said heating process at a temperature that falls within a range of about 500-1200° C. for a duration that falls within a range of 1 minute to two hours.

15. The method of claim 12, wherein said semiconductor material comprises silicon-germanium ($Si_{(1-x)}Ge_x$ where "x" ranges from 0.35-1) or a III-V material.

16. The method of claim 15, wherein said semiconductor material further comprises a Group III material wherein a concentration of said Group III material is at least about $10^{21}$ ions/cm$^3$.

17. The method of claim 12, wherein said fin formation trenches have a depth that falls within a range of about 100-150 nm.

18. The method of claim 12, wherein said semiconductor material is formed so as to induce a compressive stress on said channel portion.

19. The method of claim 12, wherein said performing said first etching process removes substantially the entire vertical height of said exposed portions of said overall fin structure.

20. The method of claim 12, wherein growing said semiconductor material comprises performing an epitaxial growth process to grow said semiconductor material.

21. A method, comprising:
forming a plurality of fin formation trenches in a semiconductor substrate so as to thereby define an overall fin structure having a vertical height;

forming a layer of silicon dioxide in said fin formation trenches, said layer of silicon dioxide having an upper surface that is located so as to expose a portion of said overall fin structure;

forming a gate structure above said layer of silicon dioxide and around said exposed portion of said overall fin structure, said gate structure comprising at least one sidewall spacer and a gate cap layer;

performing at least one first etching process to remove substantially all of said vertical height of portions of said overall fin structure that are not covered by said gate structure so as to result in the definition of a remaining portion of said overall fin structure that is positioned under said gate structure wherein said remaining portion comprises a channel portion and a lower portion located under said channel portion;

after performing said at least one first etching process, performing at least one second etching process to remove substantially all of said layer of silicon dioxide that is not covered by said gate structure;

forming a layer of heat-expandable material adjacent said remaining portion of said overall fin structure, wherein said layer of heat-expandable material comprises a material having a coefficient of thermal expansion that is substantially different than that of said semiconductor substrate;

performing a first recess etching process on said layer of heat-expandable material such that it has a first recessed upper surface that is positioned at a level that is approximately equal to an upper surface of said channel portion of said remaining portion of said overall fin structure;

after performing said first recess etching process, performing a heating process at a temperature that falls within a range of about 500-1200° C. on said layer of heat-expandable material so as to cause said layer of heat-expandable material to expand;

after performing said heating process, performing a second recess etching process on said layer of heat-expandable material such that it has a second recessed upper surface that exposes edges of said channel portion of said remaining portion of said overall fin structure; and performing an epitaxial growth process to grow a silicon-germanium semiconductor material above said second recessed upper surface of said layer of heat-expandable material using said exposed edges of said channel portion as a growth surface, wherein said grown silicon-germanium semiconductor material covers said exposed edges of said channel portion.

* * * * *